(12) United States Patent
Chang et al.

(10) Patent No.: US 9,991,866 B2
(45) Date of Patent: Jun. 5, 2018

(54) COMMON MODE FILTER, SIGNAL PASSING MODULE AND METHOD OF MANUFACTURING COMMON MODE FILTER

(71) Applicant: SAMSUNG ELECTRO-MECHANICS CO., LTD., Suwon-Si, Gyeonggi-Do (KR)

(72) Inventors: Geon Se Chang, Seoul (KR); Won Chul Sim, Seongnam-si (KR); Jeong Min Cho, Seongnam-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 225 days.

(21) Appl. No.: 14/701,507

(22) Filed: Apr. 30, 2015

(65) Prior Publication Data

US 2015/0318104 A1 Nov. 5, 2015

(30) Foreign Application Priority Data

Apr. 30, 2014 (KR) .......................... 10-2014-0052485

(51) Int. Cl.
| | |
|---|---|
| *H03H 7/09* | (2006.01) |
| *H03H 7/42* | (2006.01) |
| *H01F 27/28* | (2006.01) |
| *H01F 41/04* | (2006.01) |
| *H03H 7/01* | (2006.01) |
| *H01F 27/29* | (2006.01) |
| *H01F 17/00* | (2006.01) |
| *H03H 1/00* | (2006.01) |

(52) U.S. Cl.
CPC ......... *H03H 7/427* (2013.01); *H01F 17/0013* (2013.01); *H01F 27/2804* (2013.01);
(Continued)

(58) Field of Classification Search
CPC ................ H03H 7/427; H03H 7/0115; H03H 2001/0085; H03H 7/09
(Continued)

(56) References Cited

U.S. PATENT DOCUMENTS

| | | |
|---|---|---|
| 5,552,756 A | 9/1996 | Ushiro |
| 9,236,173 B2 | 1/2016 | Yoo et al. |

(Continued)

FOREIGN PATENT DOCUMENTS

| | | |
|---|---|---|
| CN | 1622233 A | 6/2005 |
| CN | 101763933 A | 6/2010 |

(Continued)

OTHER PUBLICATIONS

Chinese Office Action dated Aug. 26, 2016 in counterpart Chinese Patent Application No. 2015102301370 (37 pages in English; 25 pages in Chinese)

*Primary Examiner* — Rakesh Patel
(74) *Attorney, Agent, or Firm* — NSIP Law

(57) ABSTRACT

Disclosed herein is a common mode filter including: at least four coil layers, each layer having a primary coil and a secondary coil; and discontinuous parts made of an insulating material each extending between starting points of each of the primary coil and the secondary coil positioned on the lowest layer among the coil layers to ending points of each of the primary coil and the secondary coil positioned on the highest layer among the coil layers. The primary coils are connected in series from the lowest layer to the highest layer, and the secondary coils are connected in series from the lowest layer to the highest layer. The common mode filter is able to be miniaturized and has improved impedance characteristics.

30 Claims, 20 Drawing Sheets

(52) U.S. Cl.
CPC .......... *H01F 27/29* (2013.01); *H01F 27/292* (2013.01); *H01F 41/041* (2013.01); *H03H 7/01* (2013.01); *H03H 7/0115* (2013.01); *H03H 7/09* (2013.01); *H01F 2017/0093* (2013.01); *H01F 2027/2809* (2013.01); *H03H 2001/0085* (2013.01); *H03H 2001/0092* (2013.01); *Y10T 29/49018* (2015.01)

(58) Field of Classification Search
USPC ........................................ 333/177, 181, 185
See application file for complete search history.

(56) References Cited

U.S. PATENT DOCUMENTS

| | | | |
|---|---|---|---|
| 2003/0134612 | A1 | 7/2003 | Nakayama et al. |
| 2005/0116793 | A1 | 6/2005 | Shoji |
| 2010/0157565 | A1 | 6/2010 | Yoshida et al. |
| 2012/0030400 | A1* | 2/2012 | Kim .................... G06F 13/4072 710/313 |
| 2013/0147592 | A1 | 6/2013 | Yoo et al. |
| 2013/0234819 | A1 | 9/2013 | Yoo et al. |
| 2013/0265131 | A1 | 10/2013 | Yang et al. |
| 2014/0062615 | A1 | 3/2014 | Yoo et al. |
| 2014/0232501 | A1 | 8/2014 | Kato |

FOREIGN PATENT DOCUMENTS

| | | |
|---|---|---|
| CN | 102545820 A | 7/2012 |
| CN | 103165259 A | 6/2013 |
| CN | 103310945 A | 9/2013 |
| CN | 103680812 A | 3/2014 |
| JP | 2002-190410 A | 7/2002 |
| JP | 2008-71821 A | 3/2008 |
| JP | 2008-147537 A | 6/2008 |
| WO | WO 2013/065716 A1 | 5/2013 |

* cited by examiner

[FIG. 1]
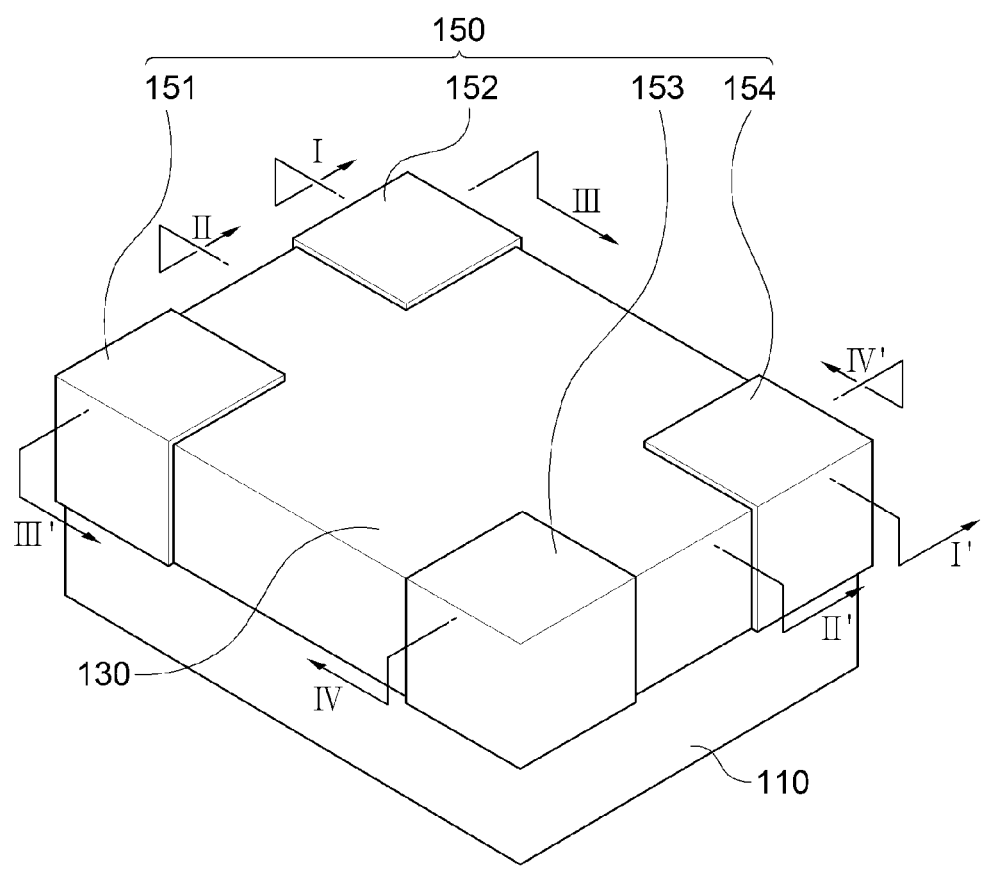

[FIG. 2]
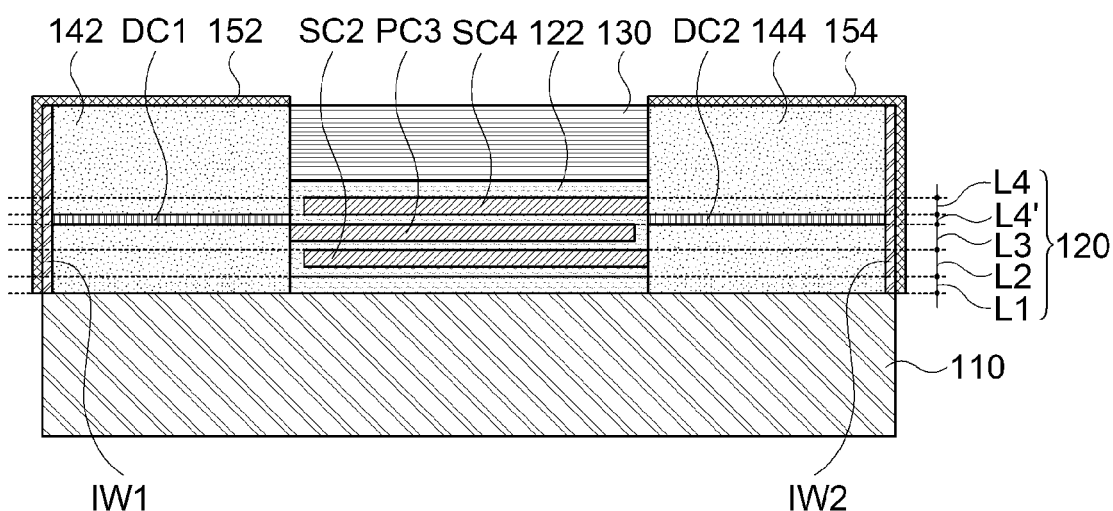
[FIG. 3A]
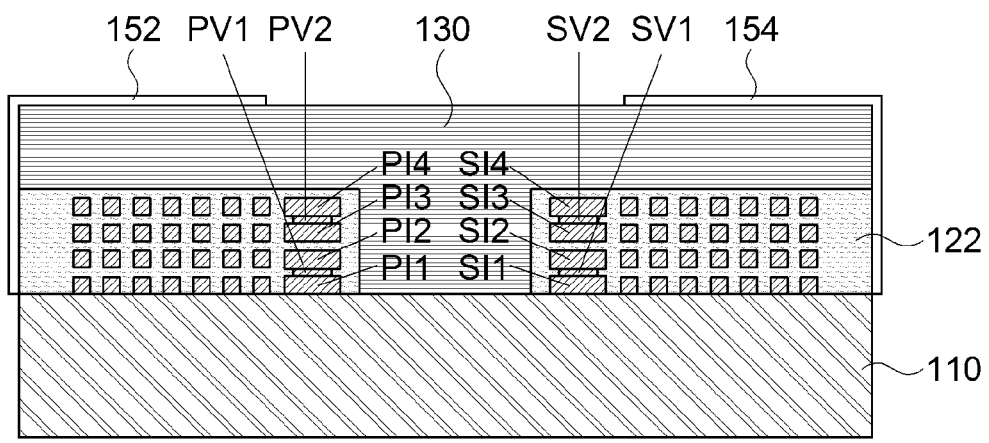
[FIG. 3B]
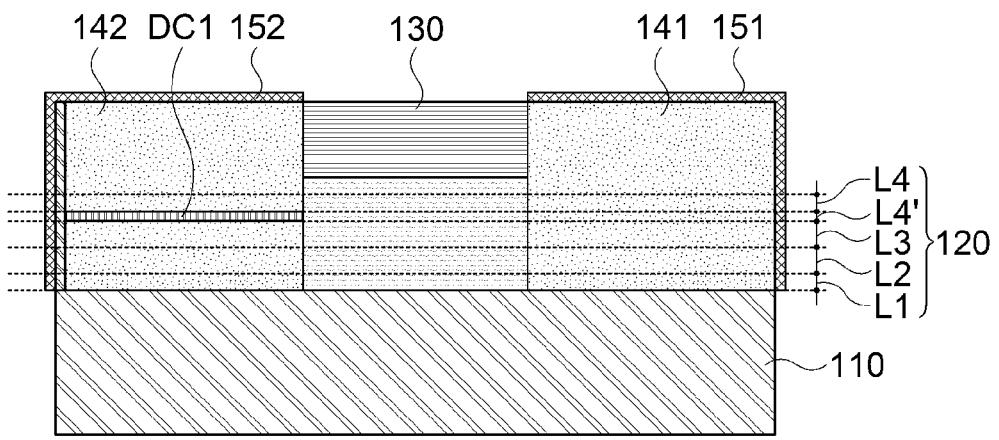

[FIG. 3C]
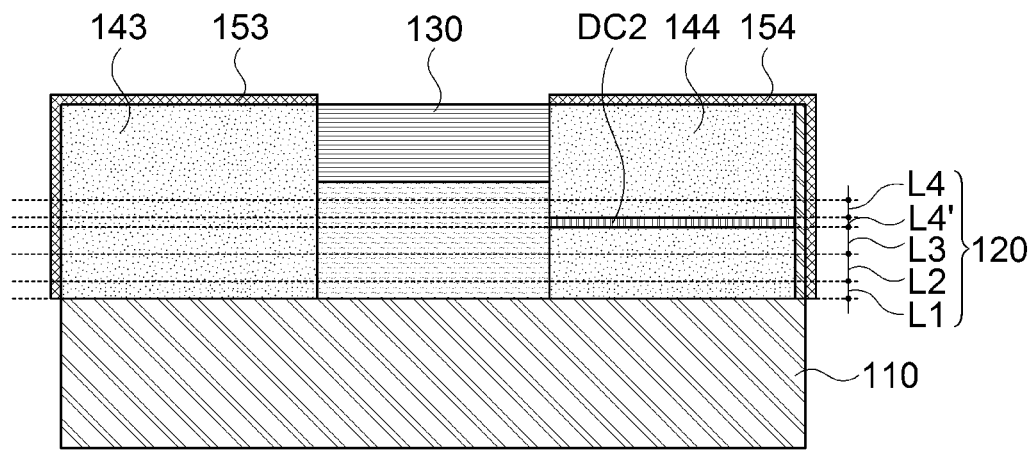
[FIG. 4A]
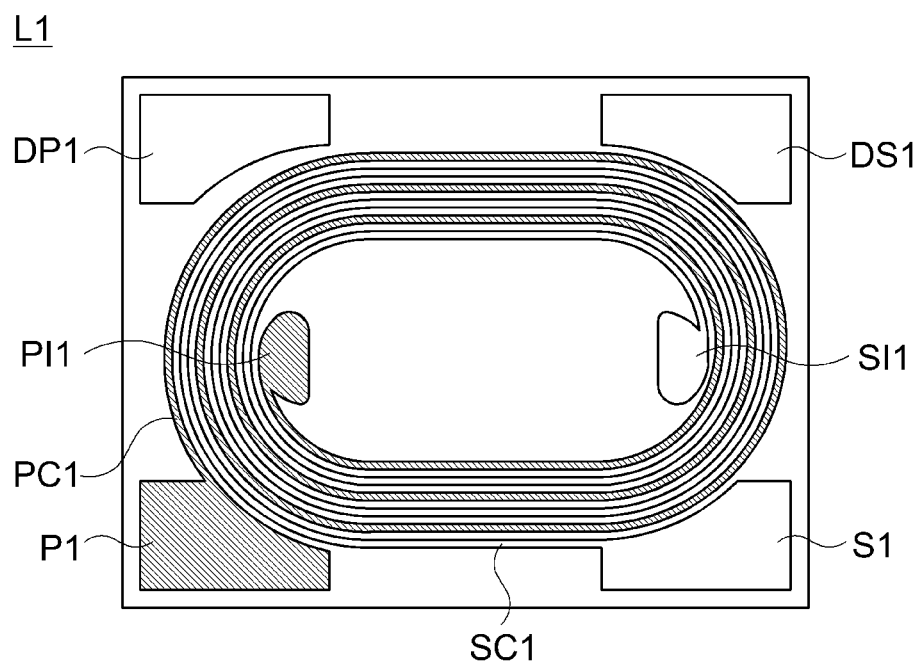

[FIG. 4B]
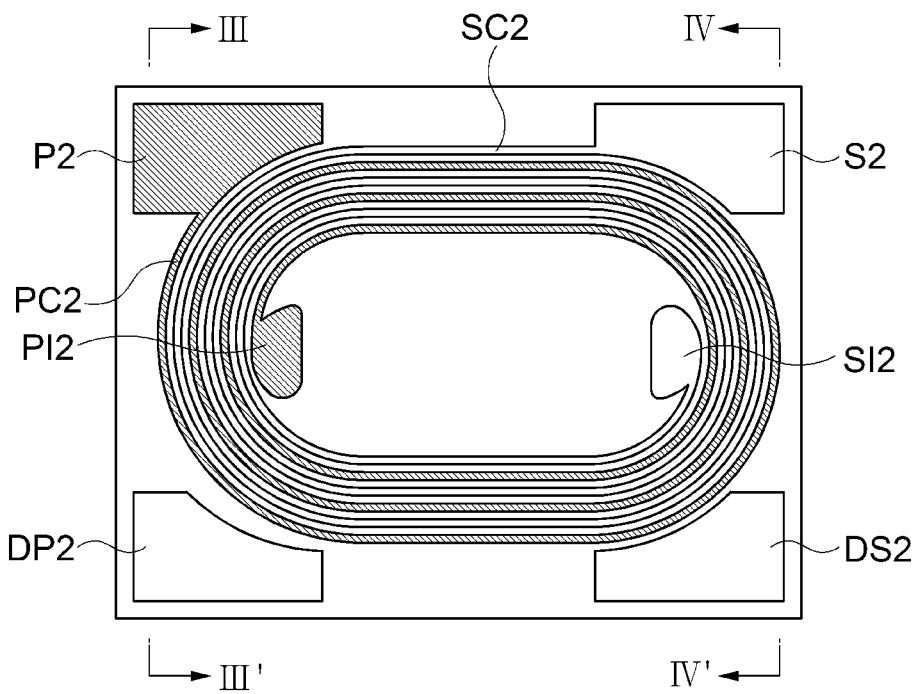
[FIG. 4C]
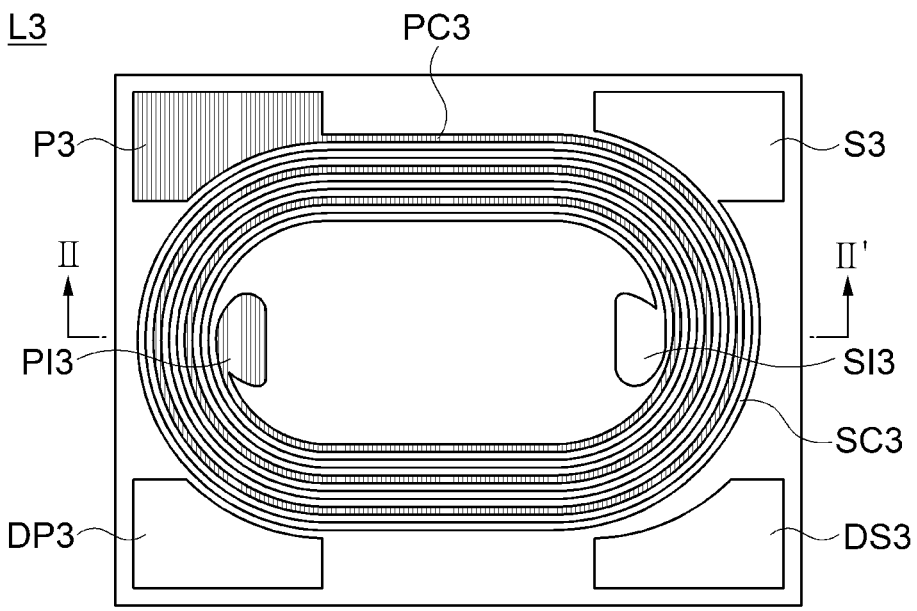

[FIG. 4D]
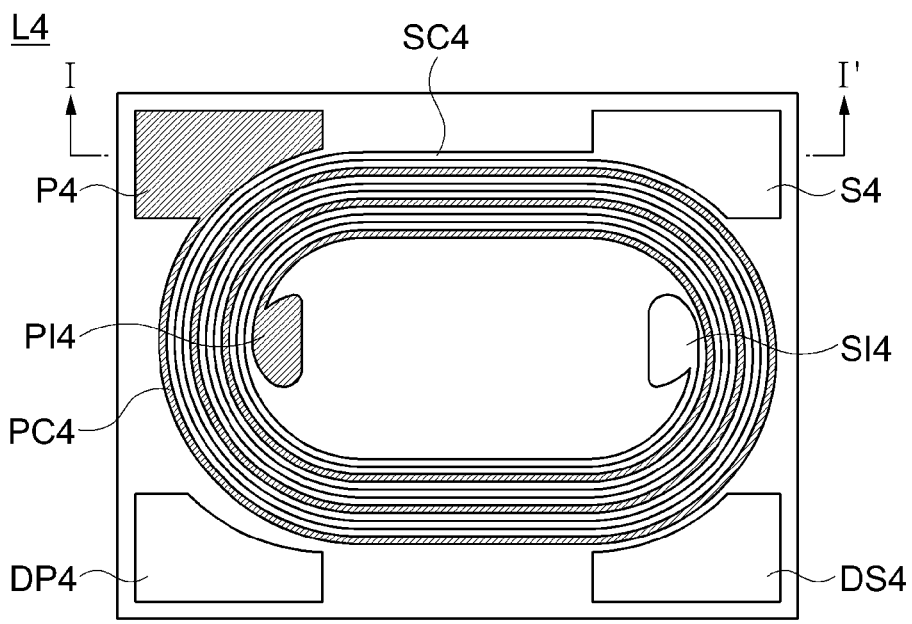
[FIG. 5]
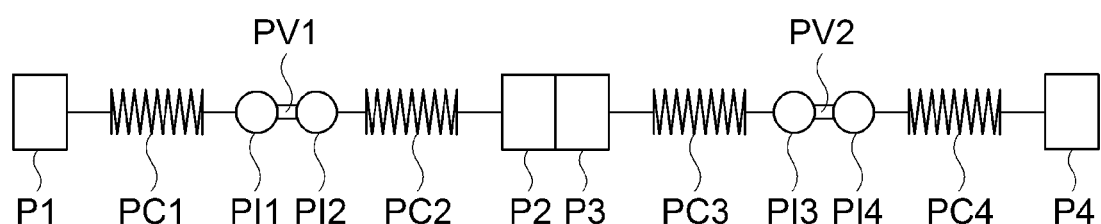

[FIG. 6]
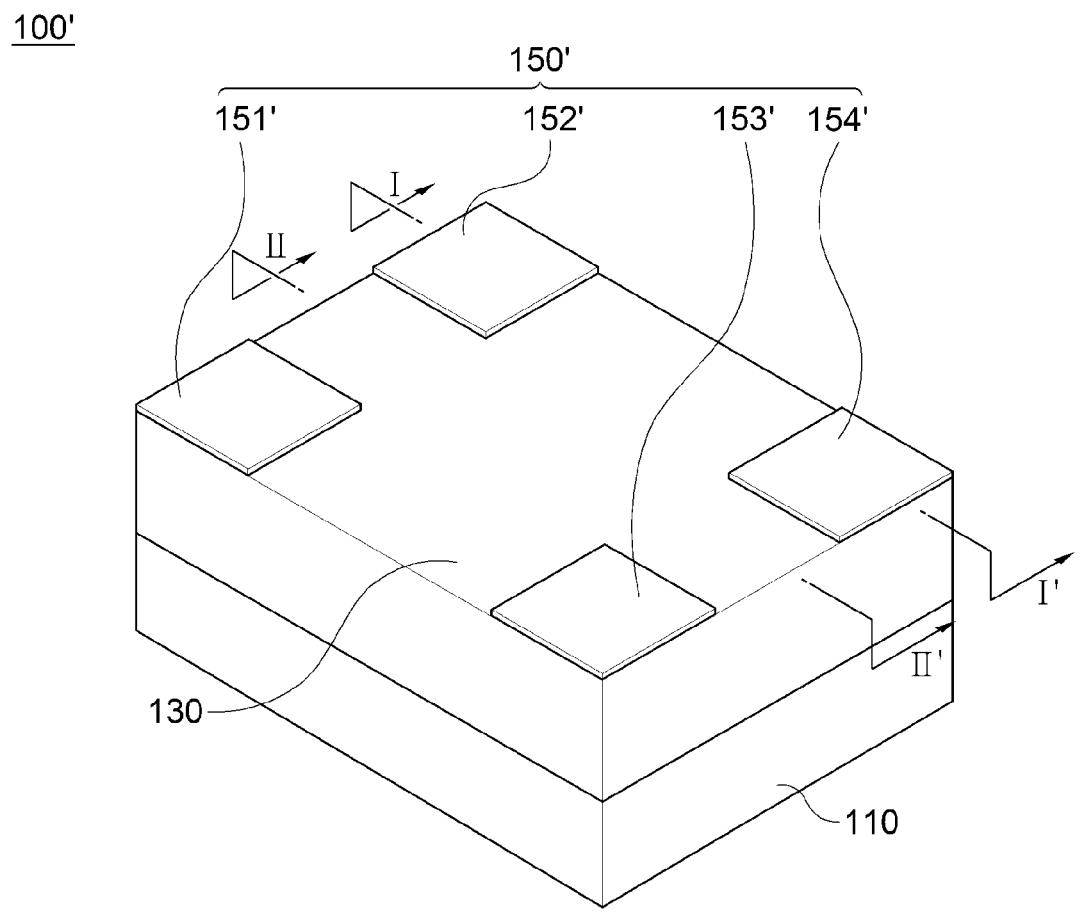
[FIG. 7]
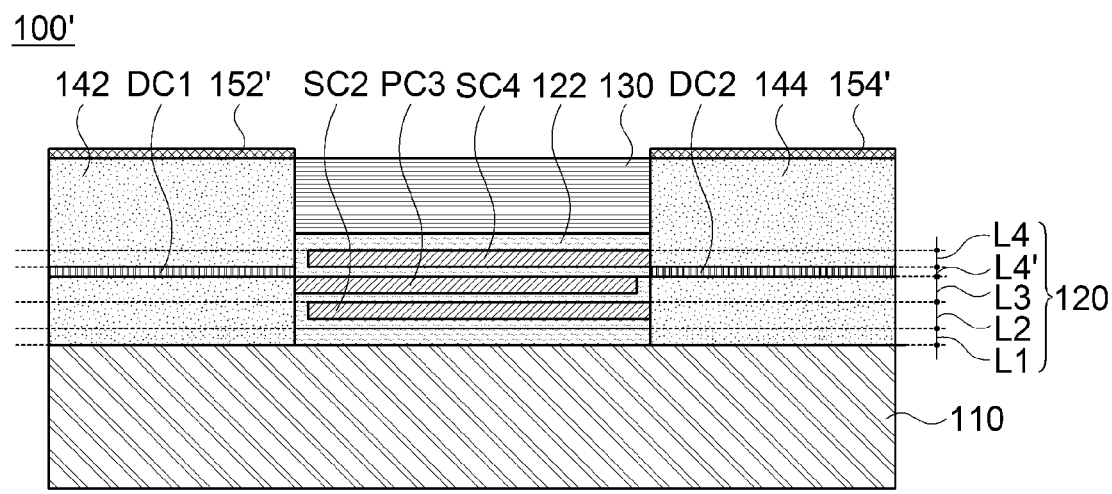

[FIG. 8]
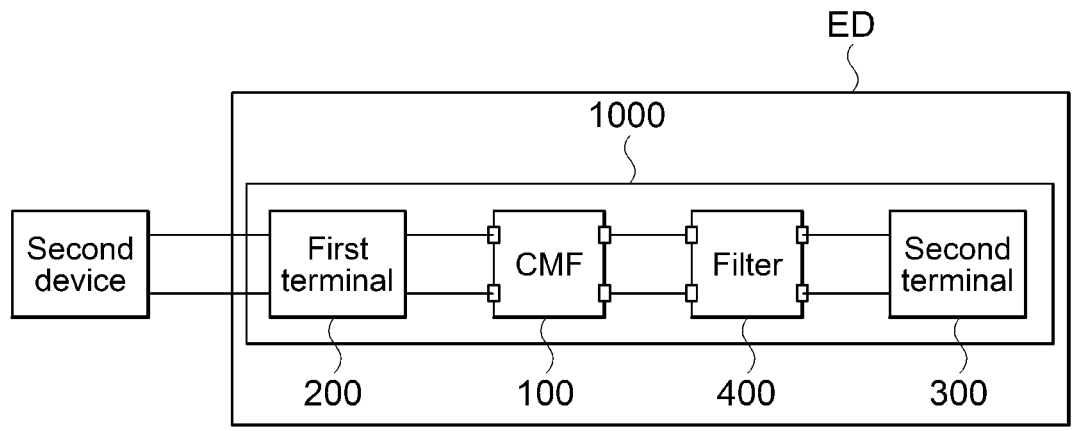
[FIG. 9]
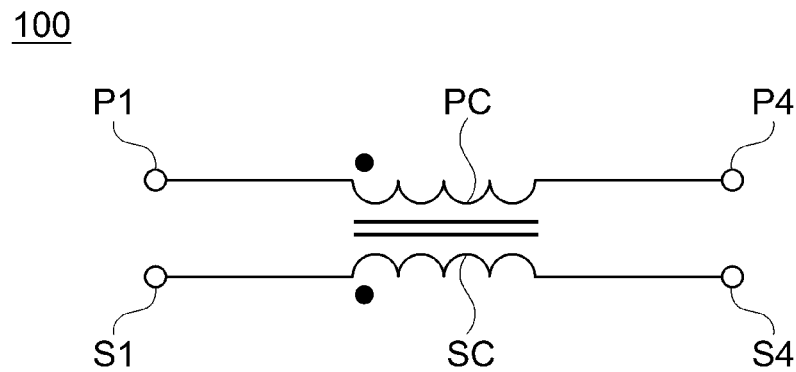

[FIG. 10A]
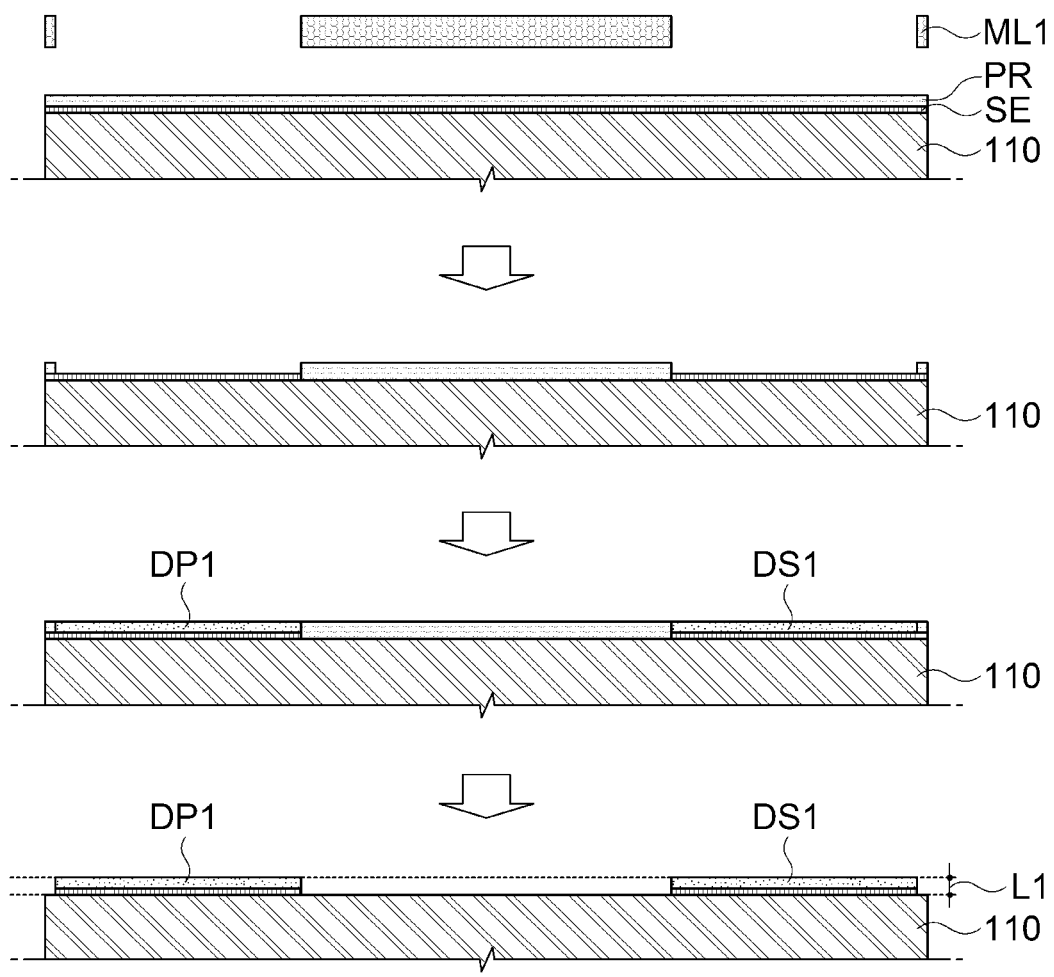

[FIG. 10B]
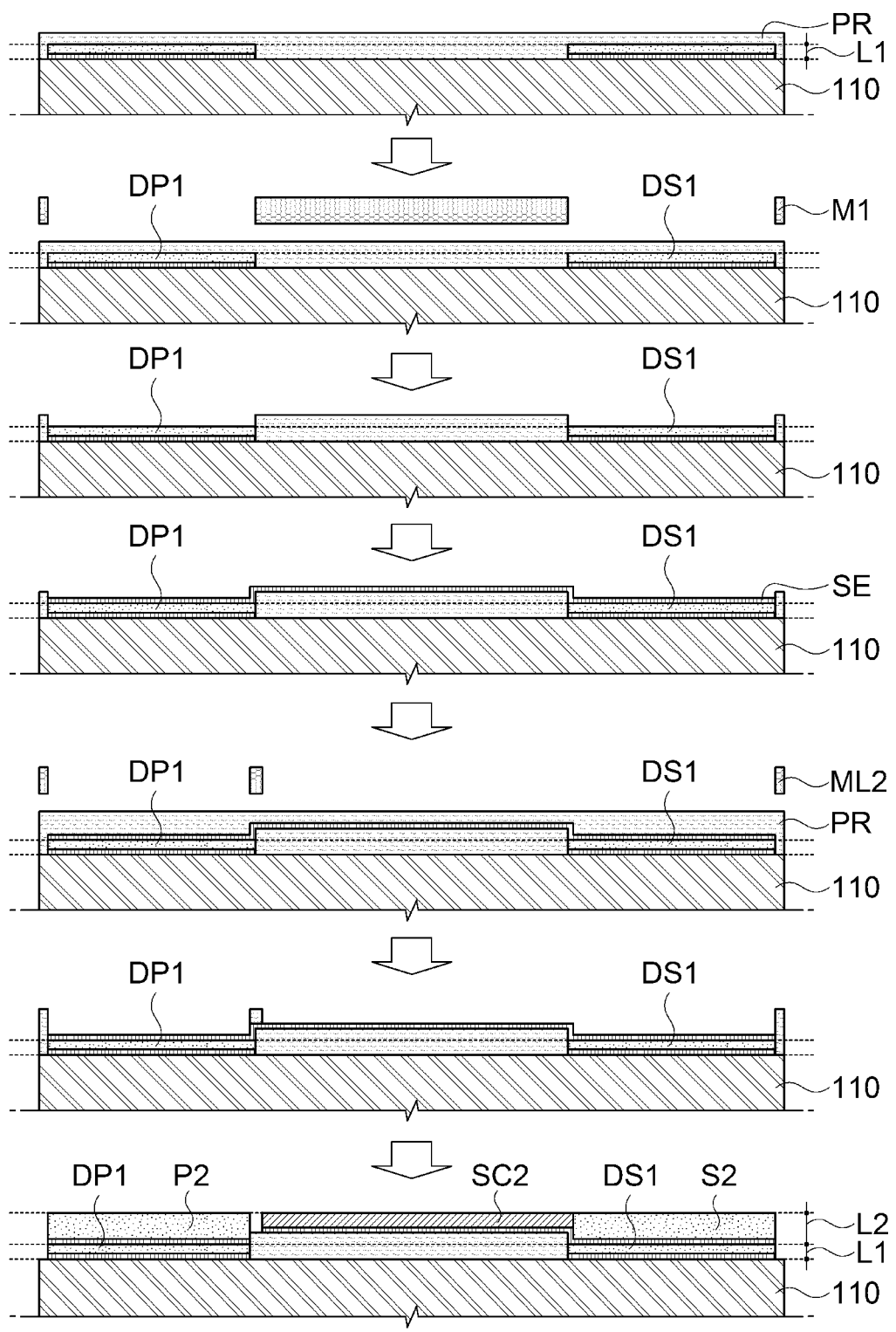

[FIG. 10C]
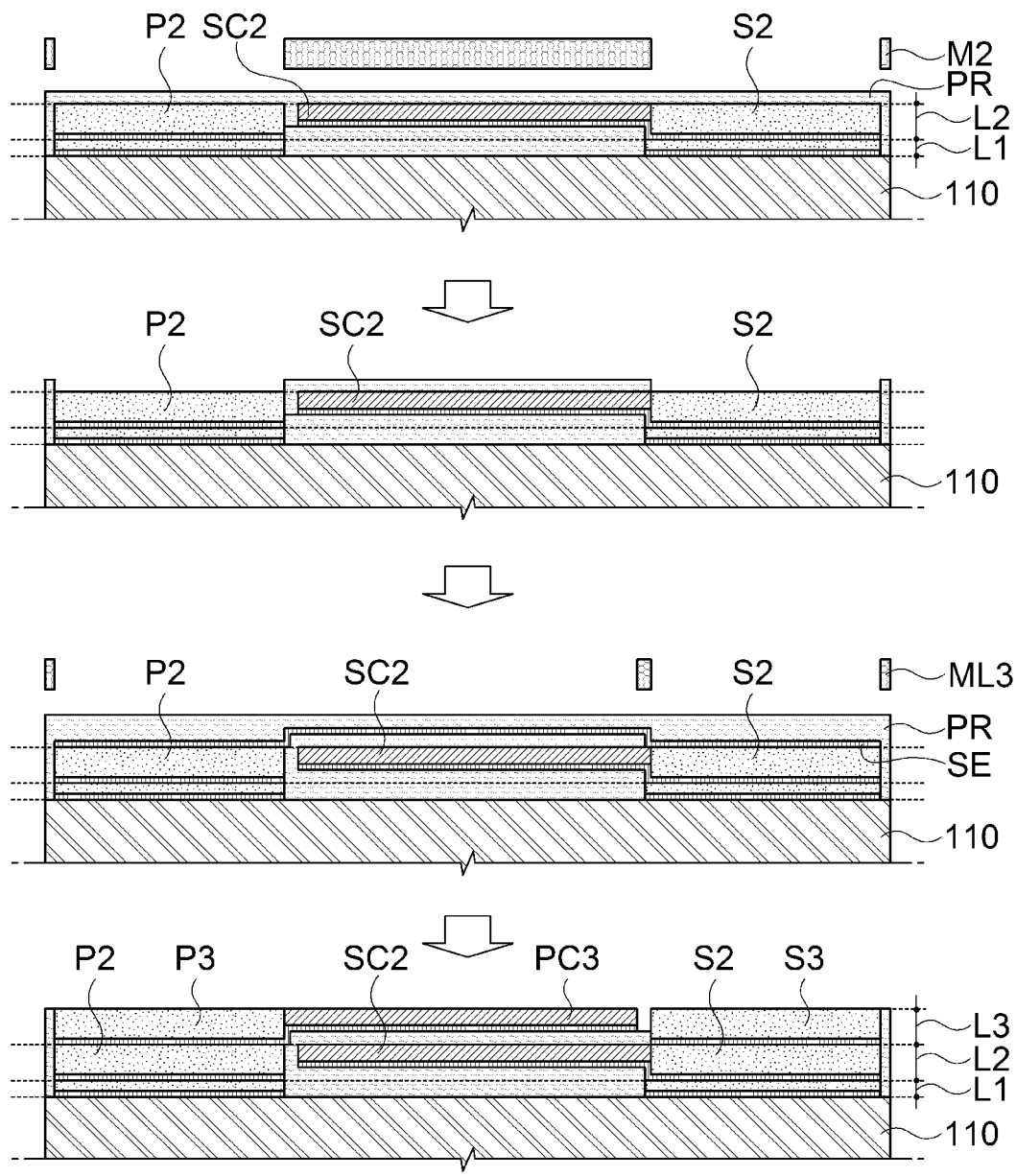

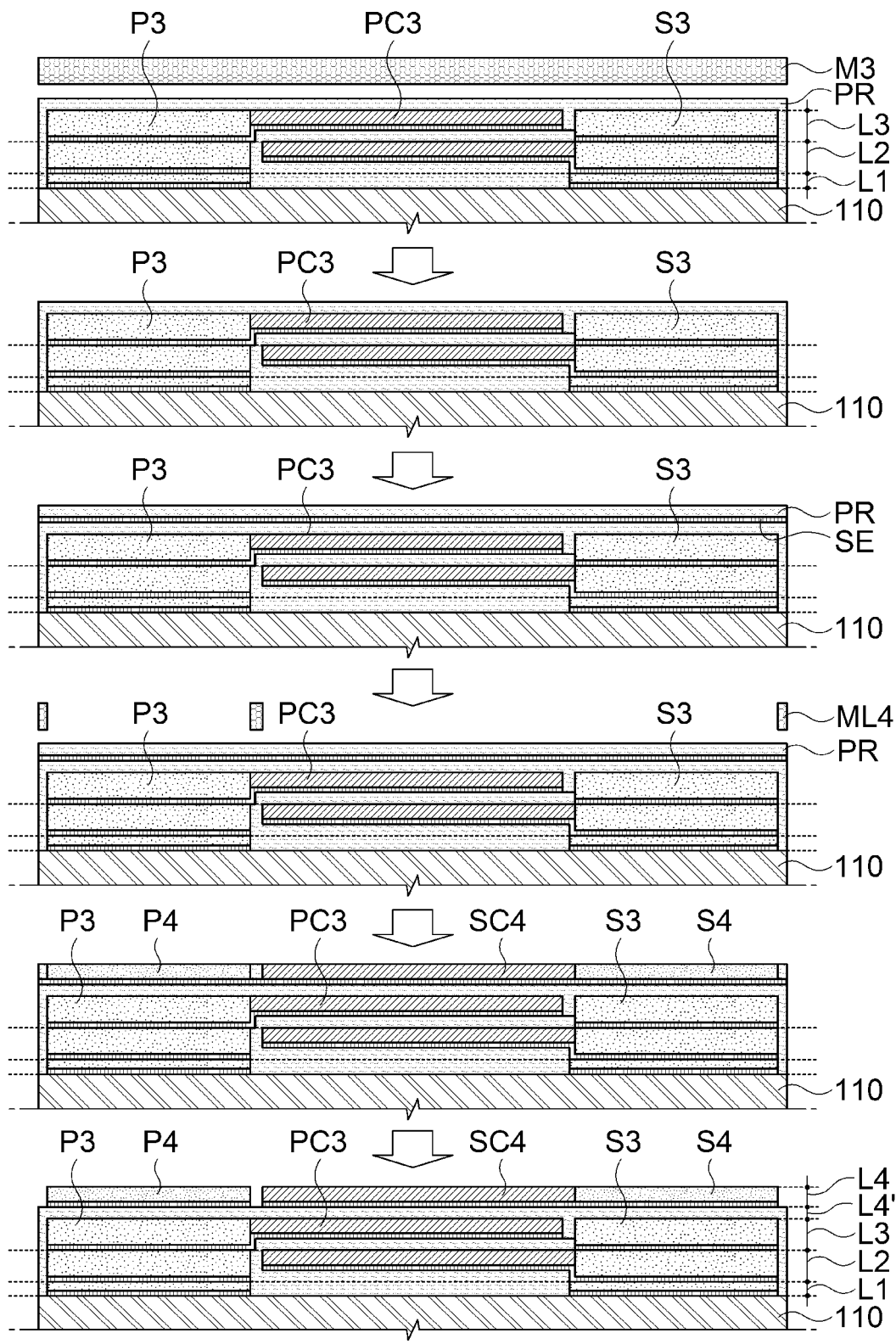
[FIG. 10D]

[FIG. 10E]
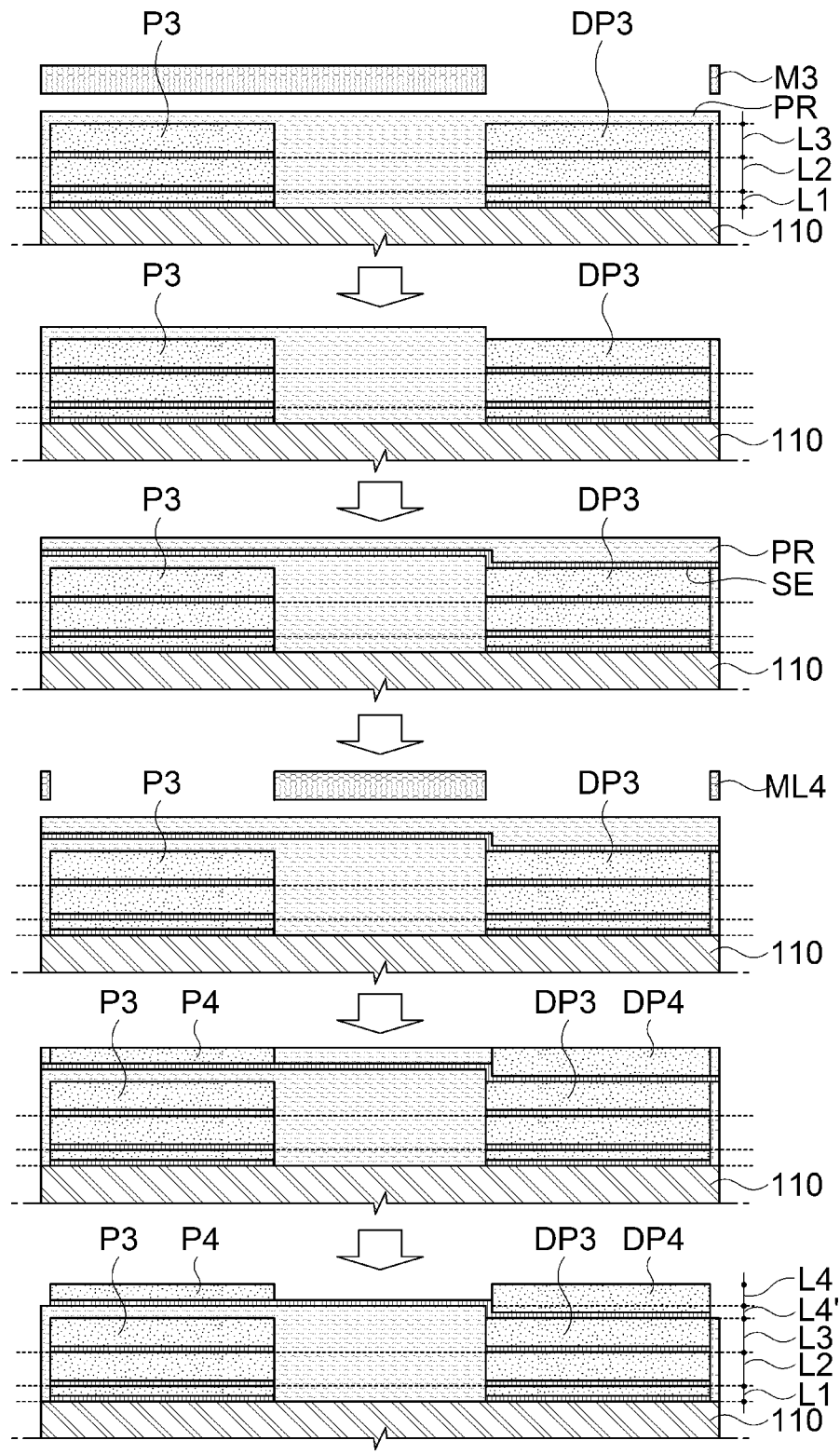

[FIG. 11A]
ML1
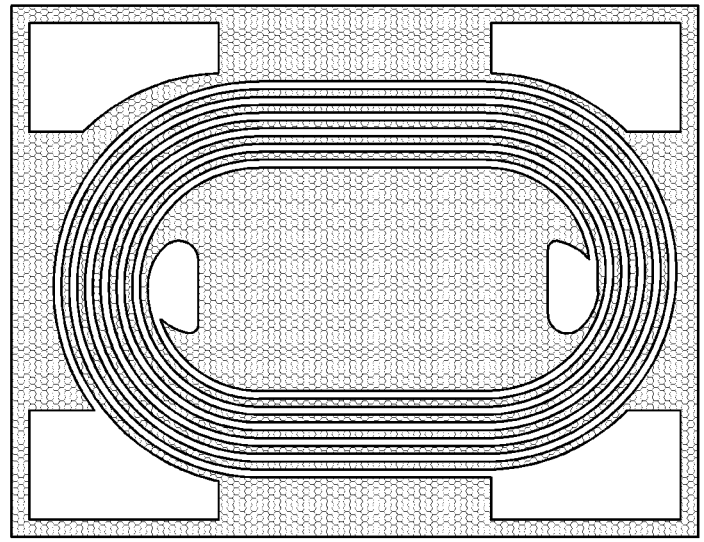
[FIG. 11B]
ML2
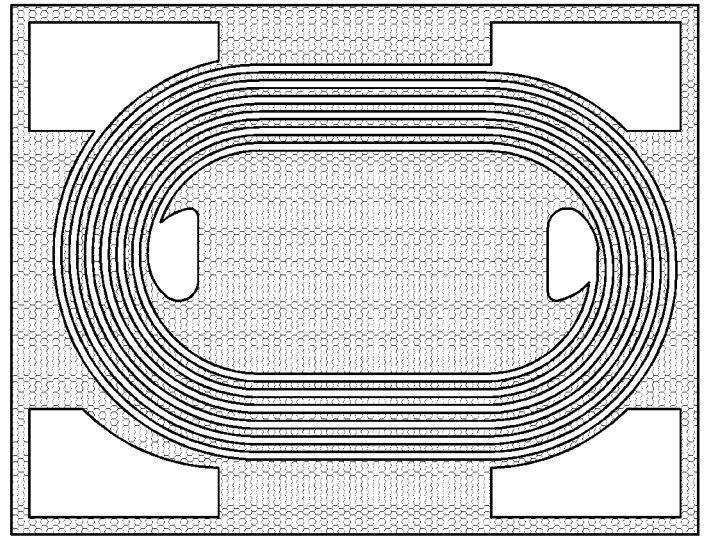

[FIG. 11C]
ML3
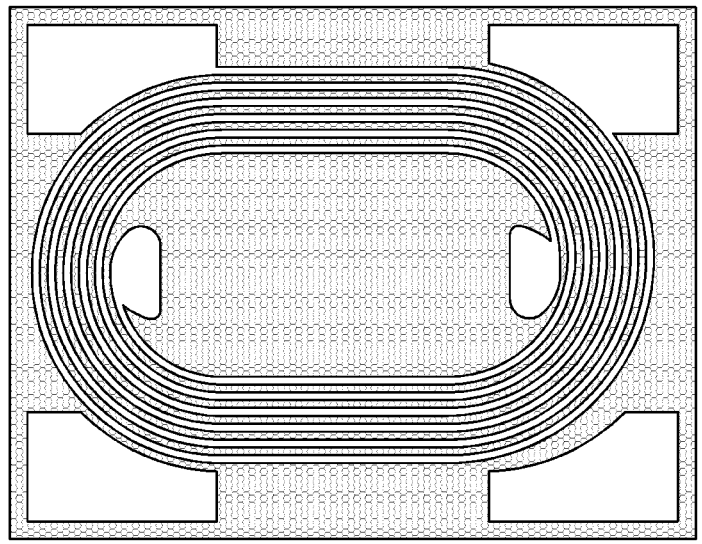
[FIG. 11D]
ML4
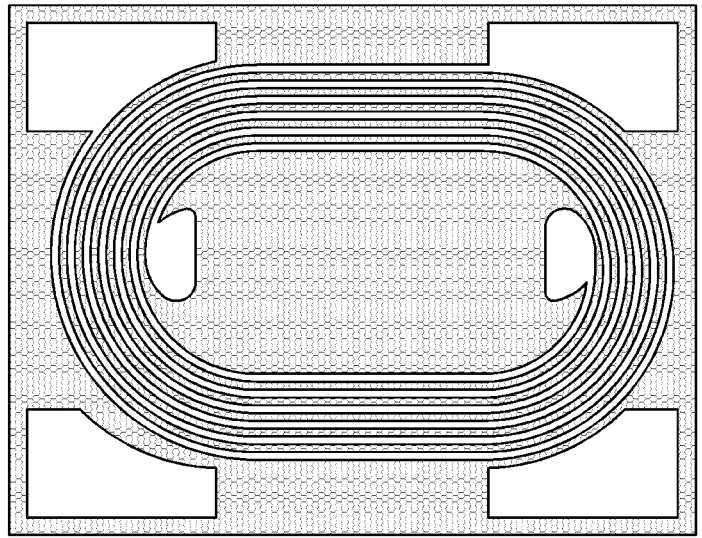

[FIG. 11E]
M1
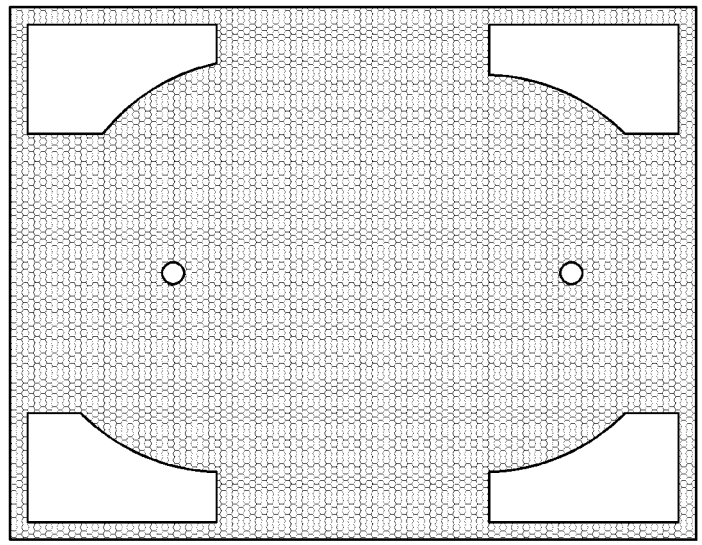
[FIG. 11F]
M2
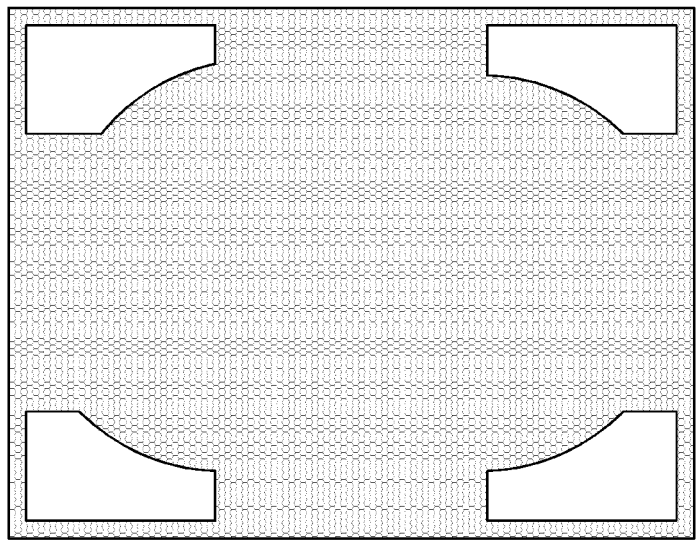

[FIG. 11G]
M3
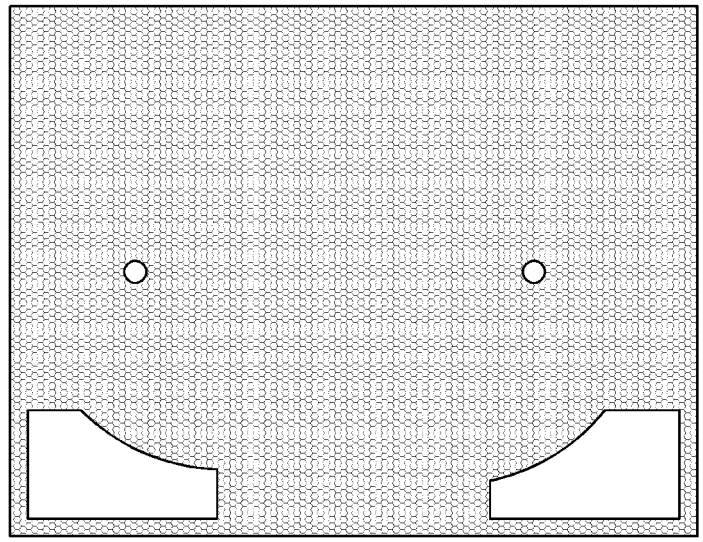
[FIG. 11H]
M3
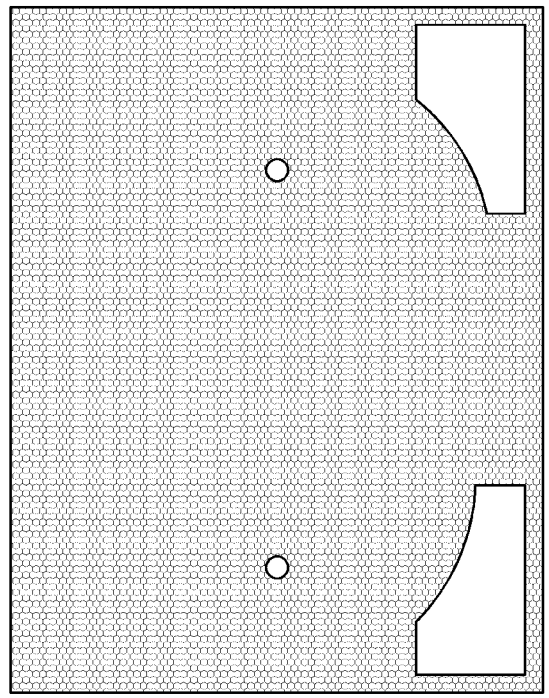

[FIG. 11I]
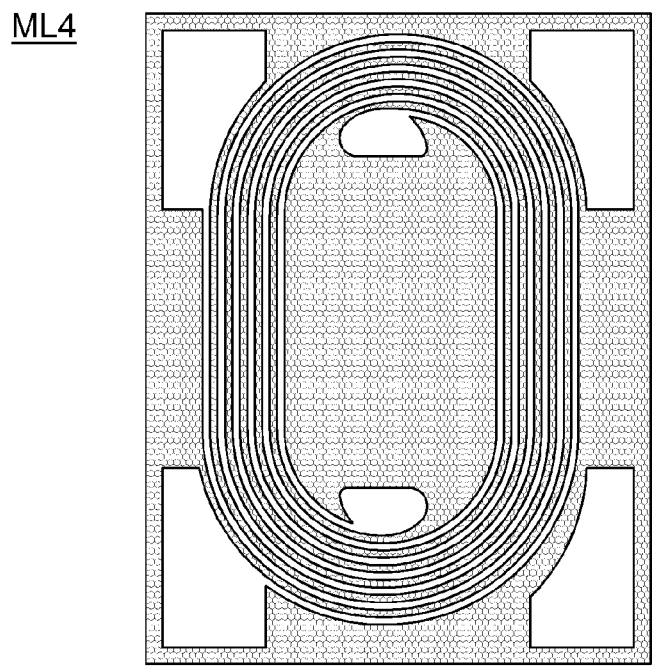
[FIG. 12]
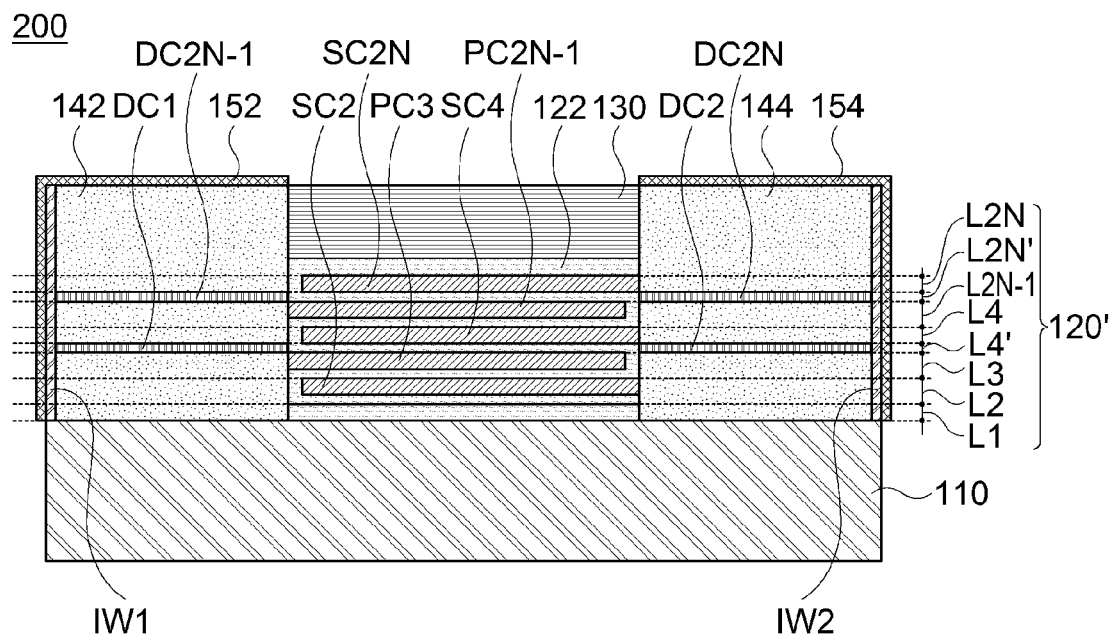

[FIG. 13A]
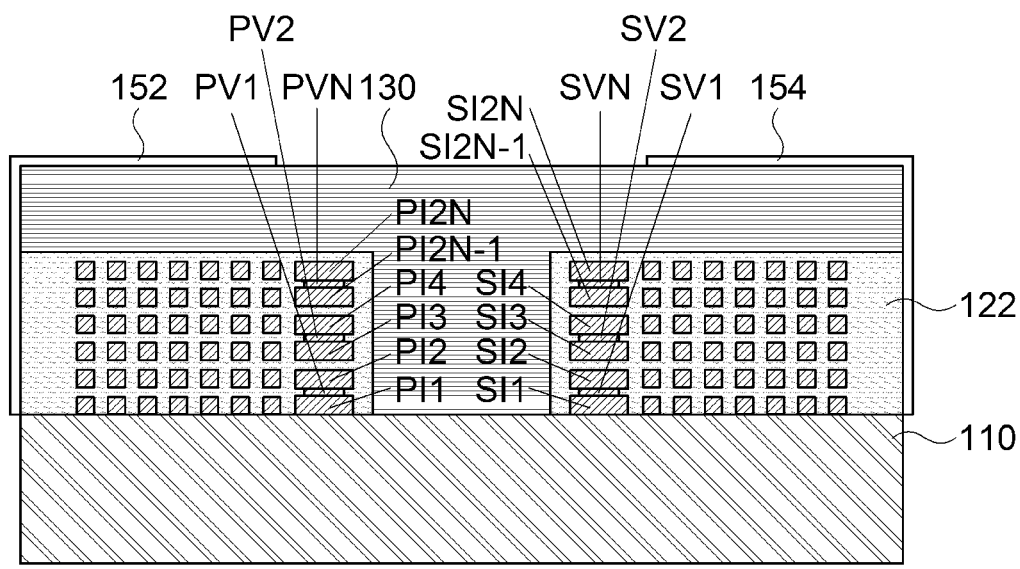
[FIG. 13B]
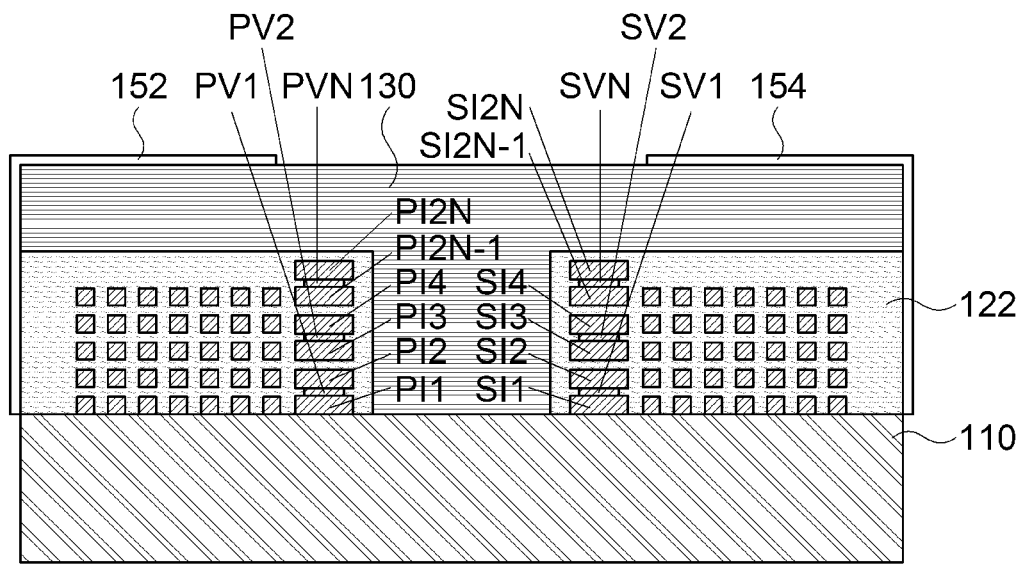

[FIG. 14A]
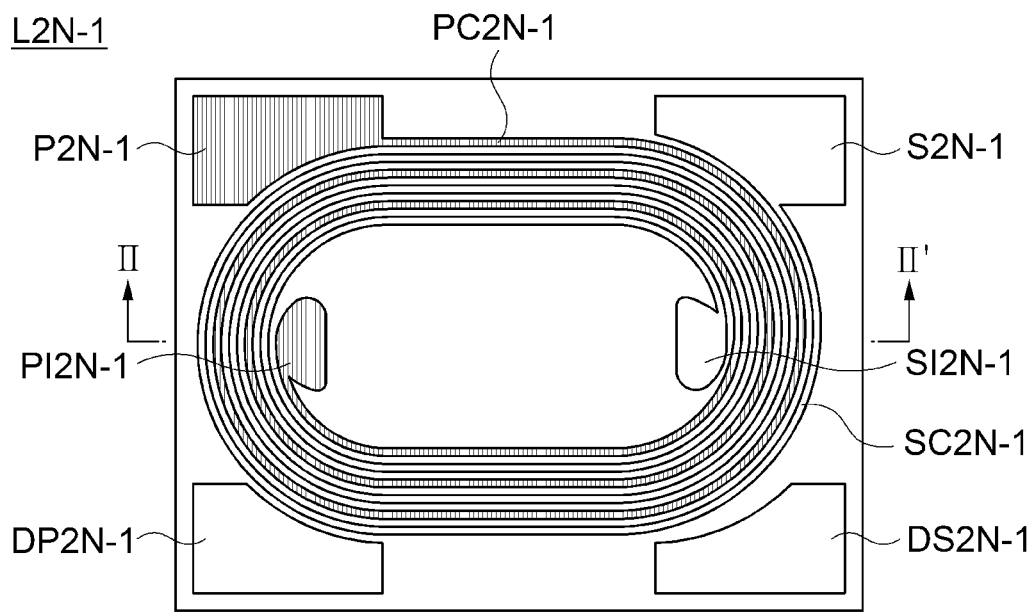
[FIG. 14B]
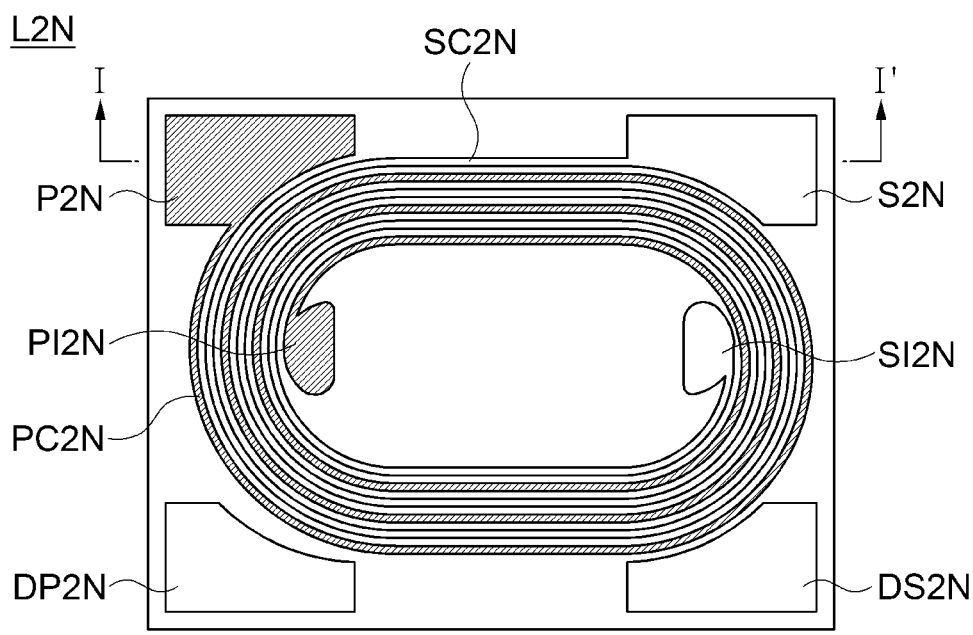

[FIG. 14C]
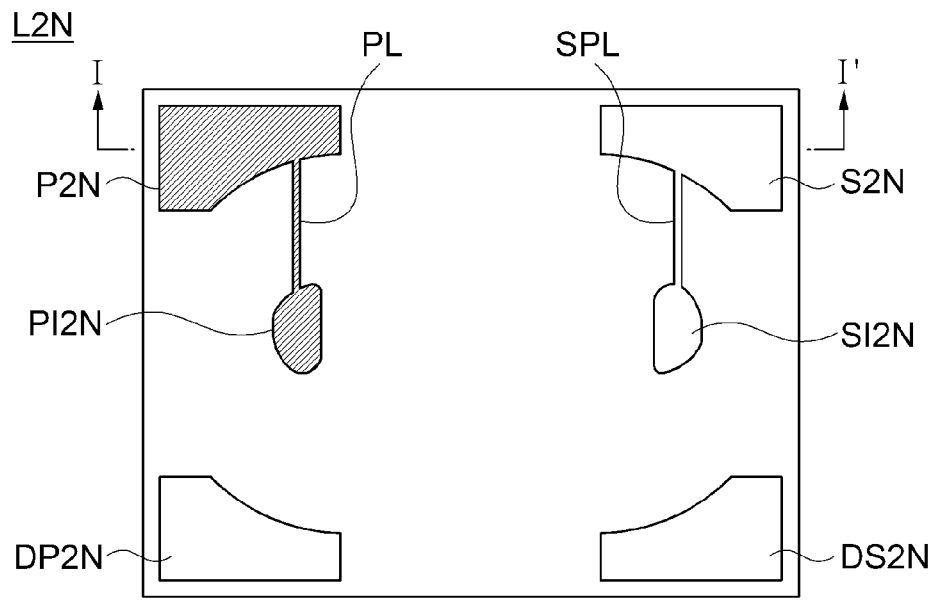
[FIG. 15]
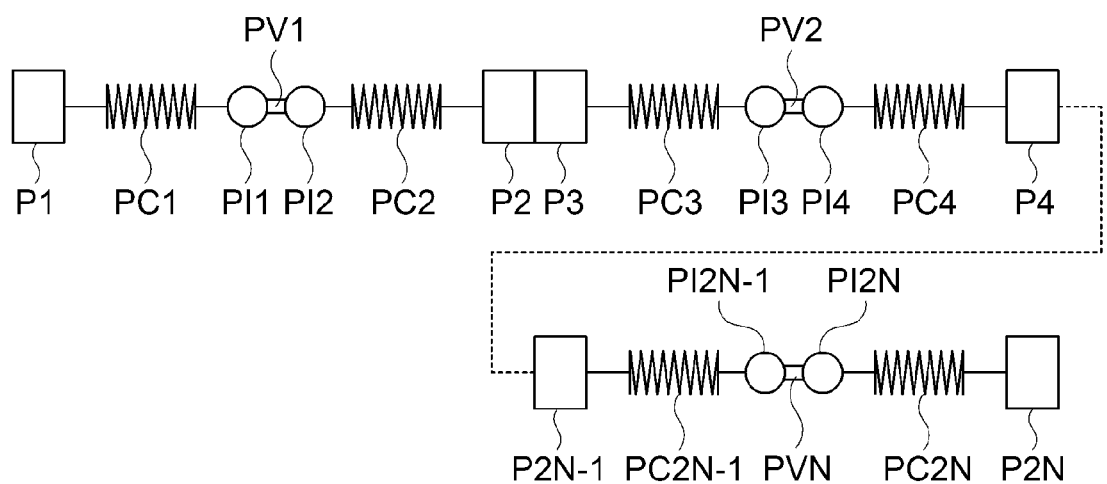

COMMON MODE FILTER, SIGNAL PASSING MODULE AND METHOD OF MANUFACTURING COMMON MODE FILTER

CROSS REFERENCE(S) TO RELATED APPLICATIONS

This application claims the benefit under 35 U.S.C. Section 119 of Korean Patent Application Serial No. 10-2014-0052485 entitled "Common Mode Filter, Signal Passing Module and Method of Manufacturing Common Mode Filter" filed on Apr. 30, 2014, which is hereby incorporated by reference in its entirety into this application.

BACKGROUND OF THE INVENTION

1. Technical Field

The present disclosure relates to a common mode filter.

2. Description of the Related Art

A common mode filter is an electronic component that has been widely used in order to remove common mode noise in various electronic devices.

In accordance with the recent trend toward miniaturization, slimness, and multi-functionalization of electronic components, research has been conducted toward a common mode filter capable of being miniaturized and thinned simultaneously with improving noise removing performance.

SUMMARY OF THE INVENTION

An object of the present invention is to miniaturize a common mode filter and improve impedance characteristics.

Objects of the present invention are not limited to the above-mentioned objects. That is, other objects that are not mentioned may be obviously understood by those skilled in the art to which the present invention pertains from the following description.

According to an exemplary embodiment of the present invention, there is provided a common mode filter having four coil layers or more, each layer including a primary coil and a secondary coil, and the size of the common mode filter may be reduced and impedance characteristics may be improved.

The primary coils of the common mode filter may be connected in series from a starting point thereof to an ending point thereof; and the secondary coils of the common mode filter may be connected in series from a starting point thereof to an ending point thereof.

Each of the primary coil and the secondary coil of the respective coil layers may be connected to each of the primary coil and the secondary coil, respectively, of adjacent coil layers through an internal terminal or an external terminal A discontinuous part made of an insulating material may be provided between one coil layer and external terminals provided on a coil layer of an upper portion thereof to allow all of the primary coils and all of the secondary coils to be connected with each other, respectively, in series from the lowest layer to the highest layer.

Meanwhile, the common mode filter may further include an external electrode or an external plating terminal. The external terminals positioned on both surfaces of the discontinuous part need not to be directly in contact with the external plating terminal.

According to another exemplary embodiment of the present invention, there is provided a signal passing module including the common mode filter as described above provided between a first terminal and a second terminal.

According to another exemplary embodiment of the present invention, there is provided a method of manufacturing a common mode filter capable of manufacturing the common mode filter.

A layer including the discontinuous part as described above may be referred to as a function layer, and the function layer may be formed between a third coil layer and a fourth coil layer.

BRIEF DESCRIPTION OF THE DRAWINGS

FIG. 1 is a perspective view schematically showing a common mode filter according to an exemplary embodiment of the present invention;

FIG. 2 is a cross-sectional view taken along line I-I' of FIG. 1;

FIG. 3A is a cross-sectional view taken along line II-II' of FIG. 1;

FIG. 3B is a cross-sectional view taken along the line III-III' of FIG. 1;

FIG. 3C is a cross-sectional view taken along the line IV-IV' of FIG. 1;

FIG. 4A is a plan view schematically illustrating a first coil layer of the common mode filter according to the exemplary embodiment of the present invention;

FIG. 4B is a plan view schematically illustrating a second coil layer of the common mode filter according to the exemplary embodiment of the present invention;

FIG. 4C is a plan view schematically illustrating a third coil layer of the common mode filter according to the exemplary embodiment of the present invention;

FIG. 4D is a plan view schematically illustrating a fourth coil layer of the common mode filter according to the exemplary embodiment of the present invention;

FIG. 5 is a view schematically illustrating a connection relationship between primary coils according to an exemplary embodiment of the present invention;

FIG. 6 is a perspective view schematically illustrating a common mode filter according to another exemplary embodiment of the present invention;

FIG. 7 is a cross-sectional view taken along line I-I' of FIG. 6;

FIG. 8 is a block diagram schematically illustrating a signal passing module according to an exemplary embodiment of the present invention;

FIG. 9 is a circuit diagram schematically illustrating a common mode filter according to an exemplary embodiment of the present invention;

FIGS. 10A to 10E illustrate a method of manufacturing a common mode filter according to an exemplary embodiment of the present invention, where:

FIG. 10A is a cross-sectional view schematically illustrating a process of forming a first coil layer with respect to a cross-section taken along line I-I' of FIG. 1;

FIG. 10B is a cross-sectional view schematically illustrating a process of forming a second coil layer with respect to a cross-section taken along line I-I' of FIG. 1;

FIG. 10C is a cross-sectional view schematically illustrating a process of forming a third coil layer with respect to a cross-section taken along line I-I' of FIG. 1;

FIG. 10D is a cross-sectional view schematically illustrating a process of forming a fourth coil layer with respect to a cross-section taken along line I-I' of FIG. 1;

FIG. 10E is a cross-sectional view schematically illustrating a process of forming a fourth coil layer with respect to a cross-section taken along line III-III' of FIG. 1;

FIGS. 11A to 11I are plan views of the respective masks which are used in a method of manufacturing a common mode filter according to an exemplary embodiment of the present invention, where:

FIG. 11A is a plan view of a mask for a first layer;
FIG. 11B is a plan view of a mask for a second layer;
FIG. 11C is a plan view of a mask for a third layer;
FIG. 11D is a plan view of a mask for a fourth layer;
FIG. 11E is a plan view of a first mask;
FIG. 11F is a plan view of a second mask;
FIG. 11G is a plan view of a third mask;
FIG. 11H is a plan view of a state in which the third mask of FIG. 11G is rotated counterclockwise by 90°;
FIG. 11I is a plan view of a state in which the mask for the fourth layer of FIG. 11D is rotated counterclockwise by 90°;

FIG. 12 is a cross-sectional view schematically illustrating a cross-section which is obtained by cutting the common mode filter according to another exemplary embodiment of the present invention along line I-I' of FIG. 1;

FIG. 13A is a cross-sectional view schematically illustrating a cross-section which is obtained by cutting the common mode filter according to another exemplary embodiment of the present invention along line II-II' of FIG. 1;

FIG. 13B is a cross-sectional view schematically illustrating a cross-section which is obtained by cutting a common mode filter according to still another exemplary embodiment of the present invention along line II-II' of FIG. 1;

FIG. 14A is a plan view schematically illustrating a (2N−1)-th coil layer of the common mode filter according to another exemplary embodiment of the present invention;

FIG. 14B is a plan view schematically illustrating a 2N-th coil layer of the common mode filter according to another exemplary embodiment of the present invention;

FIG. 14C is a plan view schematically illustrating a 2N-th coil layer of the common mode filter according to still another exemplary embodiment of the present invention; and FIG. 15 is a view schematically illustrating a connection relationship between primary coils according to another exemplary embodiment of the present invention.

DESCRIPTION OF THE PREFERRED EMBODIMENTS

Various advantages and features of the present invention and methods accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the invention to those skilled in the art. Meanwhile, like reference numerals throughout the specification denote like elements.

Terms used in the present specification are for explaining exemplary embodiments rather than limiting the present invention. Unless explicitly described to the contrary, a singular form includes a plural form in the present specification. The words 'comprise' and/or 'comprising', and the like will be understood to imply the inclusion of stated constituents, steps, operations and/or elements but not the exclusion of any other constituents, steps, operations and/or elements.

For purpose of simplification and clearness of illustration, a general configuration scheme will be shown in the accompanying drawings, and a detailed description of the feature and the technology which are well known in the art will be omitted. Additionally, components shown in the accompanying drawings are not necessarily shown to scale. For example, sizes of some components shown in the accompanying drawings may be exaggerated as compared with other components in order to assist in understanding of exemplary embodiments of the present invention. Like reference numerals on different drawings will denote like components, and similar reference numerals on different drawings will denote similar components, but are not necessarily limited thereto.

In the specification and the claims, terms such as "first", "second", "third", "fourth", and the like, if any, will be used to distinguish similar components from each other and be used to describe a specific sequence or a generation sequence, but is not necessarily limited thereto. For example, it may be understood that these terms are compatible with each other under an appropriate environment so that exemplary embodiments of the present invention to be described below may be operated in a sequence different from a sequence shown or described herein. Likewise, in the present specification, in the case in which it is described that a method includes a series of steps, a sequence of these steps suggested herein is not necessarily a sequence in which these steps may be executed. That is, any described step may be omitted or any other step that is not described herein may be added to the method.

In the specification and the claims, terms such as "left", "right", "front", "rear", "top", "bottom", "over", "under", and the like, if any, do not necessarily indicate relative positions that are not changed, but are used for description. It may be understood that these terms are compatible with each other under an appropriate environment so that exemplary embodiments of the present invention to be described below may be operated in a direction different from a direction shown or described herein. A term "connected" used herein is defined as being directly or indirectly connected in an electrical or non-electrical scheme. Targets described as being "adjacent to" each other may physically contact each other, be close to each other, or be in the same general range or region, in the context in which the above phrase is used. Here, a phrase "in an exemplary embodiment" means the same exemplary embodiment, but is not necessarily limited thereto.

Hereinafter, a configuration and an acting effect of exemplary embodiments of the present invention will be described in more detail with reference to the accompanying drawings.

FIG. 1 is a perspective view schematically showing a common mode filter 100 according to an exemplary embodiment of the present invention, FIG. 2 is a cross-sectional view taken along line I-I' of FIG. 1, FIG. 3A is a cross-sectional view taken along line II-II' of FIG. 1, FIG. 3B is a cross-sectional view taken along the line III-III' of FIG. 1, and FIG. 3C is a cross-sectional view taken along the line IV-IV' of FIG. 1.

In addition, FIG. 4A is a plan view schematically illustrating a first coil layer L1 of the common mode filter 100 according to the exemplary embodiment of the present invention, FIG. 4B is a plan view schematically illustrating a second coil layer L2 of the common mode filter 100 according to the exemplary embodiment of the present invention, FIG. 4C is a plan view schematically illustrating a third coil layer L3 of the common mode filter 100 according to the exemplary embodiment of the present invention, and FIG. 4D is a plan view schematically illustrating a fourth coil layer L4 of the common mode filter 100 according to the exemplary embodiment of the present invention.

In addition, FIG. 5 is a view schematically illustrating a connection relationship between primary coils PC according to an exemplary embodiment of the present invention.

Referring to FIGS. 1 to 5, the common mode filter 100 according to the exemplary embodiment of the present invention may include four coil layers L1, L2, L3 and L4 including primary coils PC and secondary coils SC. Here, a component including the four coil layer L1, L2, L3 and L4 may be referred to as a coil part 120.

In addition to the four coil layers, the common mode filter 100 may include a substrate 110 made of a magnetic material such as ferrite or the like, a magnetic body part 130, an insulating part 122, external electrodes 141, 142, 143 and 144, an external plating terminal 150, and the like.

Here, a scheme in which the primary coil PC and the secondary coil SC are formed in a spiral shape on the same planar surface may be referred to as a simultaneous coil scheme. This simultaneous coil scheme is different from a so-called single coil scheme in which the primary coil and the second coil are formed to be included in different layers from each other.

In this case, when predetermined impedance characteristics is implemented by forming the coil on the same area using a conducive pattern having the same line width, the common mode filter of the simultaneous coil scheme may be implemented by the number of layers smaller than the common mode filter of the single coil scheme.

For example, in the case in which an impedance of 30 to 35Ω is implemented by the common mode filter having an area of 0.4 mm×0.3 mm, when the simultaneous coil scheme is used, the impedance may be implemented by two coil layers, while when the single coil scheme is used, four coil layers may be required.

Meanwhile, the existing common mode filter of the simultaneous coil scheme has been generally implemented in a form including two coil layers or less.

However, in order to improve the impedance characteristics while performing miniaturization, the common mode filter 100 according to the exemplary embodiment of the present invention may include four coil layers or more including the primary coil PC and the secondary coil SC.

In this case, the primary coil and the secondary coil included in each of the coil layers need not directly contact the primary coil and the secondary coil, respectively, formed on the adjacent layer. To this end, the insulating part 122 may be provided between the conductive patterns. In addition, the primary coil and the secondary coil included in each of the coil layers may be connected to the primary coils and the secondary coils, respectively, included in adjacent coil layers through internal terminals or external terminals.

Planar shapes of the first coil layer L1 to the fourth coil layer L4 may be understood with reference to FIGS. 4A to 4D.

For example, according to an exemplary embodiment of the present invention, a first primary coil PC1 and a first secondary coil SC1 may be formed together in a spiral shape on the first coil layer L1 in a state in which they are spaced apart from each other by a predetermined distance, a first primary external terminal P1 may be connected to one end of the first primary coil PC1, and a first primary internal terminal PI1 may be connected to the other end of the first primary coil PC1. Similarly, a first secondary external terminal S1 may be connected to one end of the first secondary coil SC1 and a first secondary internal terminal SI1 may be connected to the other end of the first secondary coil SC1.

Meanwhile, the second coil layer L2 to the fourth coil layer L4 may also be implemented in the form similar to that as described above.

Here, referring to FIG. 5, according to an exemplary embodiment of the present invention, it may be understood that the primary coil may be connected in series from a starting point thereof to an ending point thereof, since the first primary external terminal P1, the first primary coil PC1, the first primary internal terminal PI1, a first primary via PV1, a second primary internal terminal PI2, a second primary coil PC2, a second primary external terminal P2, a third primary external terminal P3, a third primary coil PC3, a third primary internal terminal PI3, a second primary via PV2, a fourth primary internal terminal PI4, a fourth primary coil PC4, and the fourth primary external terminal P4 are sequentially connected in the above-mentioned order.

Of course, although not shown, the secondary coil may also be connected in series by the same manner. That is, it may be understood that the secondary coil may be connected in series from a starting point thereof to an ending point thereof, since the first secondary external terminal S1, the first secondary coil SC1, the first secondary internal terminal SI1, a first secondary via SV1, a second secondary internal terminal SI2, a second secondary coil SC2, a second secondary external terminal S2, a third secondary external terminal S3, a third secondary coil SC3, a third secondary internal terminal S13, a second secondary via SV2, a fourth secondary internal terminal SI4, a fourth secondary coil SC4, and the fourth secondary external terminal S4 are sequentially connected in the above-mentioned order.

Meanwhile, FIG. 8 is a block diagram schematically illustrating a signal passing module 1000 according to an exemplary embodiment of the present invention and FIG. 9 is a circuit diagram schematically illustrating a common mode filter 100 according to an exemplary embodiment of the present invention.

Referring to FIG. 8, the signal passing module 1000 according to the exemplary embodiment of the present invention may include a first terminal 200, a common mode filter 100, and a second terminal 300. Various filters 400 such as an LC filter, and the like may be further provided between the common mode filter 100 and the second terminal 300, if necessary.

The signal passing module 1000 mentioned above may be provided in a first electronic device ED to serve to transmit and receive signals to and from another external device, for example, a second electronic device illustrated in FIG. 8.

Here, if it is assumed that the first electronic device ED and the second electronic device transmits and receives a differential mode signal to transmit and receive predetermined data to and from each other, a common mode signal which is interposed during the signal transmission and reception process may be considered as noise, and the common mode filter 100 may serve to reduce the common mode noise as described above.

First, the first terminal 200 may be selectively connected or blocked to or from the second electronic device.

In addition, the common mode filter 100 as described above or to be described below may be connected to the first terminal 200.

In addition, the second terminal 300 may be directly connected to the common mode filter 100 or connected to the common mode filter 100 via a filter 400 to serve to output a signal in which at least a portion of the common mode noise is removed.

Referring to FIG. 9, in the common mode filter 100 according to the exemplary embodiment of the present invention, the starting point of the primary coil PC may be the first primary external terminal P1 and the ending point of the primary coil PC may be the fourth primary external terminal P4. In addition, the starting point of the secondary coil SC may be the first secondary external terminal S1 and the ending point of the secondary coil SC may be the fourth secondary external terminal S4.

As such, only if both ends of the primary coil and both ends of the secondary coil are each provided with the terminals, the common mode filter 100 may be connected onto a signal transmission and reception path to perform a function of removing the common mode noise.

In addition, referring to FIGS. 1 to 3C, according to an exemplary embodiment of the present invention, the first primary external terminal P1 may be connected to a first primary external electrode 141, the fourth primary external terminal P4 may be connected to a second primary external electrode 142, the first secondary external terminal S1 may be connected to a first secondary externally electrode 143, and the fourth secondary external terminal S4 may be connected to a second secondary external electrode 144. Further, the first primary external electrode 141 may be connected to a first primary external plating terminal 151, the second primary external electrode 142 may be connected to a second primary external plating terminal 152, the first secondary external electrode 143 may be connected to a first secondary external plating terminal 153, and the second secondary external electrode 144 may be connected to the second secondary external plating terminal 154. As a result, the first primary external plating terminal 151 may be connected to the first primary external terminal P1, the second primary external plating terminal 152 may be fourth primary external terminal P4, the first secondary external plating terminal 153 may be connected to the first secondary external terminal S1, and the second secondary external plating terminal 154 may be connected to the fourth primary external terminal P4.

Accordingly, the first primary external electrode 141 or the first primary external plating terminal 151 may be connected to the first terminal 200, and the first secondary external electrode 143 or the first secondary external plating terminal 153 may be connected to the first terminal 200.

In addition, the second primary external electrode 142 or the second primary external plating terminal 152 may be connected to the second terminal 300, and the second secondary external electrode 144 or the second secondary external plating terminal 154 may be connected to the second terminal 300.

Meanwhile, referring to FIGS. 4A to 5, in the common mode filter 100 according to an exemplary embodiment of the present invention, the first primary external terminal P1 and the second primary external terminal P2 are provided to a position at which they are not overlapped with each other in a vertical projection region, while the second primary external terminal P2, the third primary external terminal P3 and the fourth primary external terminal P4 are provided to a position at which they are overlapped with one another in the vertical projection region. As a result, the common mode filter 100 as illustrated in FIG. 9 may be implemented.

Here, referring to FIG. 5, it may be understood that the second primary external terminal P2 and the third primary external terminal P3 are directly connected to each other, while the third primary external terminal P3 and the fourth primary external terminal P4 need not to be directly connected to each other.

As described above, since the second primary external terminal P2, the third primary external terminal P3, and the fourth primary external terminal P4 are provided to the position at which they are overlapped with each other in the vertical projection region, the second primary external terminal P2 and the third primary external terminal P3 may be directly connected to each other. However, since the third primary external terminal P3 and the fourth primary external terminal P4 need not to be directly connected to each other while being overlapped with each other in the vertical projection region, a separate unit may be required. In the common mode filter 100 according to the exemplary embodiment of the present invention, as the separate unit, a first discontinuous part DC1 made of an insulating material may be provided between the third primary external terminal P3 and the fourth primary external terminal P4.

Although the view such as FIG. 5 is not separately shown with respect to the secondary coil, the secondary coil may include a second discontinuous part DC2 according to a principle similar to the case of the first discontinuous part DC1 of the primary coil as set forth.

Referring to FIGS. 1 and 4D, the common mode filter 100 according to the exemplary embodiment of the present invention may further include the external electrodes 141, 142, 143 and 144 and the external plating terminal 150.

The external electrodes may be provided on the fourth coil layer L4. That is, the second primary external electrode 142 contacting an upper surface of the fourth primary external terminal P4 and the second secondary external electrode 144 contacting an upper surface of the fourth secondary external terminal S4 may be provided.

Meanwhile, the first primary external electrode 141 may be provided on the first primary external terminal P1 and the first secondary external electrode 143 may be provided on the first secondary external terminal S1. However, the first primary external electrode 141 and the first primary external terminal P1 are not directly in contact with each other, the first secondary external electrode 143 and the first secondary external terminal S1 are not directly in contact with each other. Accordingly, in the vertical projection region of the first primary external terminal P1, the second coil layer L2 may be further provided with a second dummy primary external terminal DP2, the third coil layer L3 may be further provided with a third dummy primary external terminal DP3, and the fourth coil layer L4 may be further provided with a fourth dummy primary external terminal DP4. In addition, in the vertical projection region of the first secondary external terminal S1, the second coil layer L2 may be further provided with a second dummy secondary external terminal DS2, the third coil layer L3 may be further provided with a third dummy secondary external terminal DS3, and the fourth coil layer L4 may be further provided with a fourth dummy secondary external terminal DS4. In this case, the term Each of the first primary external terminal P1 and the first secondary external terminal S1 provided to the first coil layer L1 may be connected to each of the first primary external electrode 141 and the second primary external electrode 142 through the dummy terminals as described above.

In addition, the external plating terminal 150 may be provided on surfaces of the external electrodes 141, 142, 143 and 144, and may serve to improve efficiency of work in which the common mode filter 100 is mounted on a circuit board (not shown) of the electronic device, or the like and to improve adhesion between the common mode filter 100 and the circuit board (not shown). In addition, the external plating terminal 150 may be implemented using typical nickel or a nickel alloy.

Meanwhile, the external plating terminal 150 may be formed on an upper surface of the external electrode as well as a side thereof. However, it has been described in the common mode filter 100 according to the exemplary embodiment of the present invention that the first discontinuous part DC1 may be provided to a vertically downward region of the second primary external electrode 142, and the second discontinuous part DC2 may be provided to a vertically downward region of the second secondary external electrode 144. The first discontinuous part DC1 and the second discontinuous part DC2 may perform an insulating function enabling each of the primary coil and the secondary coil to be connected in series from the starting point to the ending point. Accordingly, at least the second primary external plating terminal 152 contacting the second primary external electrode 142 and the second secondary external plating terminal 154 contacting the second secondary external electrode 144 need not to be directly in contact with the external terminals provided to downward regions of at least the first discontinuous part DC1 and the second discontinuous part DC2. That is, the second primary external plating terminal 152 contacting the second primary external electrode 142 need not to be directly in contact with the third primary external terminal P3 and the second primary external terminal P2, and the second primary external plating terminal 152 contacting the second primary external electrode 142 need not to be directly in contact with the third secondary external terminal S3 and the second secondary external terminal S2. To this end, a first insulating wall IW1 formed of an insulating material may be provided at least between the third primary external terminal P3 and the second primary external terminal P2, and the second primary external plating terminal 152. In addition, a second insulating wall IW2 formed of an insulating material may be provided at least between the third secondary external terminal S3 and the second secondary external terminal S2, and the second secondary external plating terminal 154.

FIG. 6 is a perspective view schematically illustrating a common mode filter 100' according to another exemplary embodiment of the present invention and FIG. 7 is a cross-sectional view taken along line I-I' of FIG. 6.

Referring to FIGS. 6 and 7, it may be understood that the same object may be implemented without having the first insulating wall IW1 and the second insulating wall IW2 as describe above by providing a second primary external plating terminal 152' and a second secondary external plating terminal 154' to only on an upper surface of the common mode filer 100.

FIGS. 10A to 10E illustrate a method of manufacturing a common mode filter 100 according to an exemplary embodiment of the present invention, where: FIG. 10A is a cross-sectional view schematically illustrating a process of forming a first coil layer L1 with respect to a cross-section taken along line I-I' of FIG. 1, FIG. 10B is a cross-sectional view schematically illustrating a process of forming a second coil layer L2 with respect to a cross-section taken along line I-I' of FIG. 1, FIG. 10C is a cross-sectional view schematically illustrating a process of forming a third coil layer L3 with respect to a cross-section taken along line I-I' of FIG. 1, FIG. 10D is a cross-sectional view schematically illustrating a process of forming a fourth coil layer L4 with respect to a cross-section taken along line I-I' of FIG. 1, and FIG. 10E is a cross-sectional view schematically illustrating a process of forming a fourth coil layer L4 with respect to a cross-section taken along line III-III' of FIG. 1.

FIGS. 11A to 11I are plan views of the respective masks which are used in a method of manufacturing a common mode filter 100 according to an exemplary embodiment of the present invention, where: FIG. 11A is a plan view of a mask for a first layer ML1, FIG. 11B is a plan view of a mask for a second layer ML2, FIG. 11C is a plan view of a mask for a third layer ML3, FIG. 11D is a plan view of a mask for a fourth layer ML4, FIG. 11E is a plan view of a first mask M1, FIG. 11F is a plan view of a second mask M2, FIG. 11G is a plan view of a third mask M3, FIG. 11H is a plan view of a state in which the third mask M3 of FIG. 11G is rotated counterclockwise by 90°, and FIG. 11I is a plan view of a state in which the mask for the fourth layer ML4 of FIG. 11D is rotated counterclockwise by 90°.

Meanwhile, although the present specification describes the respective processes based on a lithography method of a negative scheme, it may be understood that the common mode filter may be manufactured by a lithography method or a laminate method of a positive scheme.

In addition, since FIGS. 10A to 10D are the cross-sectional views for the cross-section taken along line I-I' of FIG. 1 and FIG. 10E is the process cross-sectional view for the cross-section taken along line III-III' of FIG. 1, portions which are not visible from the cross-section taken along line I-I' and the cross-section taken along line III-III' are not indicated. However, referring to FIGS. 1 to 11I together, processes of performing the method of manufacturing the common mode filter according to the exemplary embodiment of the present invention may be sufficiently understood.

Referring to FIGS. 10A to 11I together with FIGS. 1 to 9, the method of manufacturing the common mode filter 100 according to the exemplary embodiment of the present invention may include forming first coil layer L1 to fourth coil layer L4.

In this case, the first coil layer L1 may be formed on a substrate 110 made of a magnetic material such as ferrite, or the like.

First, referring to FIG. 10A, a seed layer SE may be formed on an upper surface of the substrate 110 and a photoresist PR may be formed on an upper surface of the seed layer SE. Next, an exposure process is performed using the mask for the first layer ML1 and the photoresist PR in the exposed region may be then removed. In this case, the mask for the first layer ML1 may be a mask formed to allow light to penetrate through a portion corresponding to a region which will be provided with the first primary coil PC1, the second secondary coil SC2, the first primary internal terminal PI1, the first primary external terminal P1, the first secondary internal terminal SI1, and the second secondary external terminal S2 which configure the first coil layer L1 as described above, and one example of the mask for the first layer ML1 is illustrated in FIG. 11A.

Next, a plating process may be performed on a region in which the photoresist PR is removed, and the photoresist PR and the seed layer SE of portions except for regions having the first dummy primary external terminal DP1, the first dummy secondary external terminal DS1, and the like formed thereon may be then removed. As a result, the first coil layer L1 having a planar shape as illustrated in FIG. 4A may be formed.

Referring to FIG. 10B, in a state in which the photoresist PR is formed on the upper surface of the first coil layer L1, the exposure process may be performed using the first mask M1 and the photoresist PR in the exposed region may be then removed. In this case, one example of the first mask M1 is illustrated in FIG. 11E, and the first mask M1 may be formed to allow the light to penetrate through a position corresponding to each of the four external terminals or dummy external terminals and positions corresponding to the primary via and the secondary via.

Next, the seed layer SE may be formed on regions in which the photoresist PR exposed by the first mask M1 is removed and an upper region of the remaining photoresist PR.

Next, in a state in which the photoresist PR covering an upper portion of the seed layer SE is formed, an exposure process is performed using the mask for the second layer ML2 and the photoresist PR in the exposed region may be then removed.

Next, a plating process may be performed on a region in which the photoresist PR is removed, and the photoresist PR and the seed layer SE of portions except for regions having the second primary external terminal P2, the second secondary coil SC2, the second secondary external terminal S2, and the like formed thereon may be then removed. As a result, the second coil layer L2 having a planar shape as illustrated in FIG. 4B may be formed.

Referring to FIG. 10C, in a state in which the photoresist PR is formed on the second coil layer L2, the exposure process may be performed using the second mask M2 and the photoresist PR in the exposed region may be then removed. In this case, the second mask M2 may be formed to allow the light to penetrate through a position corresponding to each of the four external terminals or dummy external terminals, similar to the first mask M1 used in the process of forming the second coil layer L2. However, there is a difference in that the first mask M1 is formed so as to allow the light to penetrate through the regions corresponding to the primary via and the secondary via, but the second mask M2 is formed so as not to allow the light to penetrate through the regions corresponding to the primary via and the secondary via, and one example of the second mask M2 is illustrated in FIG. 11F.

Next, the seed layer SE may be formed on regions in which the photoresist PR exposed by the second mask M2 is removed and an upper region of the remaining photoresist PR.

Next, in a state in which the photoresist PR covering an upper portion of the seed layer SE is formed, an exposure process is performed using the mask for the third layer ML3 and the photoresist PR in the exposed region may be then removed.

Next, a plating process may be performed on a region in which the photoresist PR is removed, and the photoresist PR and the seed layer SE of portions except for regions having the third primary external terminal P3, the third primary coil PC3, the third secondary external terminal S3, and the like formed thereon may be then removed. As a result, the third coil layer L3 having a planar shape as illustrated in FIG. 4C may be formed.

Referring to FIGS. 10D and 10E, in a state in which the photoresist PR is formed on the upper surface of the third coil layer L3, the exposure process may be performed using the third mask M3 and the photoresist PR in the exposed region may be then removed. In this case, unlike the first mask M1, the third mask M3 is formed so as not to allow the light to penetrate through the position corresponding to each of the third primary external terminal P3 and the third secondary external terminal S3 and is formed so as to allow the light to penetrate through only the position corresponding to each of the third primary dummy external terminal and the third secondary dummy external terminal and the position corresponding to each of the primary via and the secondary via, and one example of the third mask M3 is illustrated in FIGS. 11G and 11H.

Next, the seed layer SE may be formed on regions in which the photoresist PR exposed by the third mask M3 is removed and an upper region of the remaining photoresist PR.

Next, in a state in which the photoresist PR covering an upper portion of the seed layer SE is formed, an exposure process is performed using the mask for the fourth layer ML4 and the photoresist PR in the exposed region may be then removed.

Next, a plating process may be performed on a region in which the photoresist PR is removed, and the photoresist PR and the seed layer SE of portions except for regions having the fourth primary external terminal P4, the fourth secondary coil SC4, the fourth secondary external terminal S4, the fourth dummy secondary external terminal DS4, and the like formed thereon may be then removed. As a result, the fourth coil layer L4 having a planar shape as illustrated in FIG. 4D may be formed.

Here, referring to FIGS. 10D and 10E, the photoresist PR remains between the third primary external terminal P3 and the fourth primary external terminal P4 and between the third secondary external terminal S3 and the fourth secondary external terminal S4 to thereby prevent the external terminals from being directly in contact with each other. These portions correspond to the first discontinuous part DC1 and the second discontinuous part DC2 described above with reference to FIGS. 1 to 4D. That is, although FIGS. 1 to 4D indicate a different kind of hatching from the insulating part 122 in order to allow the first discontinuous part DC1 and the second discontinuous part DC2 to be clearly understood, it may be appreciated that the first discontinuous part DC1 and the second discontinuous part DC2 may be implemented together with the insulating part 122 by the photoresist PR. Meanwhile, a layer including the first discontinuous part DC1 and the second discontinuous part DC2 may be separately referred to as a function layer L4'. That is, the function layer L4' may be provided between the third coil layer L3 and the fourth coil layer L4, and may mean a layer preventing the third primary external terminal P3 and the fourth primary external terminal P4 from being directly in contact with each other and preventing the third secondary external terminal S3 and the fourth secondary external terminal S4 from being directly in contact with each other, and allowing the third dummy primary external terminal DP3 and the fourth dummy primary external terminal DP4 to be directly in contact with each other and allowing the third dummy secondary external terminal DS3 and the fourth dummy secondary external terminal DS4 to be directly in contact with each other.

In addition, although FIGS. 10A to 10E have explicitly indicated the seed layer SE to assist in understanding for the process, FIGS. 2 to 3C have indicated the seed layer SE without being classified for purpose of simplification of the drawings.

In addition, although FIG. 3A, and the like illustrate a case in which the primary coil and the secondary coil in each coil layer are aligned in a vertical direction, coil patterns in an upper layer and a lower layer may be provided to be alternated with each other, thereby reducing parasitic capacitance between coils in the upper layer and the lower layer.

Meanwhile, although not shown, after the fourth coil layer L4 is formed, a process of forming the external electrodes on the fourth coil layer L4, a process of forming the magnetic body part 130, a process of forming the external plating terminal, and the like may be further performed. Referring to FIGS. 1 to 11I together, the process of manufacturing the above-mentioned components may be sufficiently understood.

FIG. 12 is a cross-sectional view schematically illustrating a cross-section which is obtained by cutting the common mode filter according to another exemplary embodiment of the present invention along line I-I' of FIG. 1, FIG. 13A is a cross-sectional view schematically illustrating a cross-section which is obtained by cutting the common mode filter according to another exemplary embodiment of the present invention along line II-IP of FIG. 1, FIG. 13B is a cross-sectional view schematically illustrating a cross-section which is obtained by cutting a common mode filter according to still another exemplary embodiment of the present invention along line II-II' of FIG. 1, FIG. 14A is a plan view schematically illustrating a (2N-1)-th coil layer of the common mode filter according to another exemplary embodiment of the present invention, FIG. 14B is a plan view schematically illustrating a 2N-th coil layer of the common mode filter according to another exemplary embodiment of the present invention, FIG. 14C is a plan view schematically illustrating a 2N-th coil layer of the common mode filter according to still another exemplary embodiment of the present invention, and FIG. 15 is a view schematically illustrating a connection relationship between primary coils according to another exemplary embodiment of the present invention.

Referring to FIGS. 12 to 15 together with FIGS. 1 to 11I as described above, it may be appreciated that the common mode filter according to the exemplary embodiment of the present invention may have the coil layer formed of more layers such as six layers, eight layers, or the like.

FIG. 12, or the like illustrates the four or more coil layers as a (2N-1)-th coil layer L2N-1 and a 2N-th coil layer L2N, where N is a natural number of 3 or more. That is, if N is 3, the common mode filter 200 according to the exemplary embodiment of the present invention may include first through sixth coil layers. In addition, if N is 4, the common mode filter 200 according to the exemplary embodiment of the present invention may include first through eighth coil layers.

However, only two layers of the highest portion among the four or more coil layers are shown for purpose of simplification of illustration. Although not shown, it may be appreciated that if N is the natural number of 4 or more, a (2N-2)-th coil layer, a (2N-3)-th coil layer, and the like may be further provided below the (2N-1)-th coil layer L2N-1.

Meanwhile, a (2N-1)-th primary coil PC2N-1 and a (2N-1)-th secondary coil SC2N-1 may be formed together in a spiral shape on the (2N-1)-th coil layer in a state in which they are spaced apart from each other by a predetermined distance, a (2N-1)-th primary external terminal P2N-1 may be connected to one end of the (2N-1)-th primary coil PC2N-1, and a (2N-1)-th primary internal terminal PI2N-1 may be connected to the other end of the (2N-1)-th primary coil PC2N-1. Similarly, a (2N-1)-th secondary external terminal S2N-1 may be connected to one end of the (2N-1)-th secondary coil SC2N-1 and a (2N-1)-th secondary internal terminal SI2N-1 may be connected to the other end of the (2N-1)-th secondary coil SC2N-1.

In addition, a 2N-th coil layer L2N may also be implemented in the form similar to that as described above.

However, if the fifth coil layer to the 2N-th coil layer are further provided on the fourth coil layer, discontinuous parts DC2N-1 and DC2N need to be provided between the fifth coil layer and the sixth coil layer, and between the (2N-1)-th coil layer L2N-1 and the 2N-th coil layer L2N, respectively.

Here, it was described above with reference to FIG. 5 that the first primary external terminal P1 to the fourth primary external terminal P4 are sequentially connected. Further, referring to FIG. 15, it may be understood that the primary coil may be connected in series from a starting point thereof to an ending point thereof, since the (2N-1)-th primary external terminal P2N-1, the (2N-1)-th primary coil PC2N-1, the (2N-1) primary internal terminal PI2N-1, an N-th primary via PVN, a 2N-th primary internal terminal PI2N, a 2N-th primary coil PC2N, and a 2N-th primary external terminal P2N are sequentially connected in the above-mentioned order.

In this case, the (2N-1)-th discontinuous part may be provided to a region between the (2N-1)-th primary external terminal P2N-1 and the 2N-th primary external terminal P2N.

Although not shown, the secondary coil may also be connected in series by the same manner. That is, it may be understood that the secondary coil may be connected in series from a starting point thereof to an ending point thereof by sequentially connecting a (2N-1)-th secondary external terminal S2N-1, a (2N-1)-th secondary coil SC2N-1, a (2N-1)-th secondary internal terminal SI2N-1, an N-th secondary via SVN, a 2N-th secondary internal terminal, a 2N-th secondary coil SC2N, and a 2N-th secondary external terminal S2N in the above-mentioned order.

In this case, the 2N-th discontinuous part may be provided to a region between the (2N-1)-th secondary external terminal S2N-1 and the 2N-th secondary external terminal S2N.

FIG. 14C illustrates a planar shape of a 2N-th coil layer of the common mode filter according to still another exemplary embodiment of the present invention.

In the common mode filter according to the exemplary embodiment of the present invention, the 2N-th primary internal terminal PI2N and the 2N-th primary external terminal P2N of the 2N-th coil layer may be connected to each other by a primary lead pattern PL, which is shorter than a spiral coil, instead of the primary coil formed in a spiral shape. The 2N-th secondary internal terminal SI2N and the 2N-th secondary external terminal S2N may be connected to each other by a secondary lead pattern SL, which is shorter than the spiral coil, instead of the secondary coil.

Although the exemplary embodiment of the present invention illustratively describes a case in which the primary lead pattern PL and the secondary lead pattern SL are provided on the 2N-th coil layer, the primary lead pattern and the secondary lead pattern may be provided on even-numbered layers such as the second coil layer, the fourth coil layer, and the like, instead of the primary coil or the secondary coil, if necessary.

An overlapped description for the similar matters as described above will be omitted.

According to the exemplary embodiment of the present invention, the common mode filter may be miniaturized and the impedance characteristics may be improved.

What is claimed is:

1. A method of manufacturing a common mode filter, the method comprising:

forming a first coil layer including a first primary coil having one end connected to a first primary external terminal and the other end connected to a first primary internal terminal and a first secondary coil having one end connected to a first secondary external terminal and the other end connected to a first secondary internal terminal;

forming, on the first coil layer, a second coil layer including a second primary coil having one end connected to a second primary external terminal and the other end connected to a second primary internal terminal and a second secondary coil having one end connected to a second secondary external terminal and the other end connected to a second secondary internal terminal;

forming, on the second coil layer, a third coil layer including a third primary coil having one end connected to a third primary external terminal and the other end connected to a third primary internal terminal and a third secondary coil having one end connected to a third secondary external terminal and the other end connected to a third secondary internal terminal; and forming, on the third coil layer, a fourth coil layer including a fourth primary coil having one end connected to a fourth primary external terminal and the other end connected to a fourth primary internal terminal and a fourth secondary coil having one end connected to a fourth secondary external terminal and the other end connected to a fourth secondary internal terminal, wherein a first part made of an insulating material is provided between an upper surface of the third primary external terminal and a lower surface of the fourth primary external terminal, and a second part made of an insulating material is provided between an upper surface of the third secondary external terminal and a lower surface of the fourth secondary external terminal.

2. The method according to claim 1, further comprising:
forming a primary external electrode on an upper surface of the fourth primary external terminal and forming a secondary external electrode on an upper surface of the fourth secondary external terminal.

3. The method according to claim 2, further comprising:
forming a primary external plating terminal contacting at least portion of an outer surface of the primary external electrode and forming a secondary external plating terminal contacting at least portion of an outer surface of the secondary external electrode.

4. The method according to claim 3, wherein the primary external plating terminal is formed not to be directly in contact with the second primary external terminal and the third primary external terminal, and
the secondary external plating terminal is formed not to be directly in contact with the second secondary external terminal and the third secondary external terminal.

5. A common mode filter comprising:
at least four coil layers each having a primary coil and a secondary coil; and
insulating parts, each extending between a respective starting point of each of the primary coil and the secondary coil positioned on a lowest layer among the at least four coil layers and a corresponding ending point of each of the primary coil and the secondary coil positioned on a highest layer among the at least four coil layers and configured to allow the primary coils to be connected in series from the lowest layer to the highest layer, and to allow the secondary coils to be connected in series from the lowest layer to the highest layer, wherein the primary coil and the secondary coil provided on each of the at least four coil layers are provided in a spiral shape on the same plane surface and are spaced apart from each other by a preset distance, wherein each of the primary coils and secondary coils of the at least four coil layers includes an internal terminal and an external terminal at one end of the common mode filter and another end of the common mode filter, respectively, wherein each of the external terminals of the at least four coil layers is overlapped with each of external terminals positioned thereover or thereunder in a vertical direction region, and wherein each of the external terminals contacts each of external terminals positioned thereover or thereunder, and only one coil layer among the at least four coil layers has one of the insulating parts provided between the external terminal of the coil layer and an external terminal positioned on an upper portion thereof.

6. A common mode filter comprising:
at least four coil layers each having a primary coil and a secondary coil; and
insulating parts, each extending between a respective starting point of each of the primary coil and the secondary coil positioned on a lowest layer among the at least four coil layers and a corresponding ending point of each of the primary coil and the secondary coil positioned on a highest layer among the at least four coil layers and configured to allow the primary coils to be connected in series from the lowest layer to the highest layer, and to allow the secondary coils to be connected in series from the lowest layer to the highest layer, wherein the primary coil and the secondary coil provided on each of the at least four coil layers are provided in a spiral shape on the same plane surface and are spaced apart from each other by a preset distance, wherein each of the primary coils and secondary coils of the at least four coil layers includes an internal terminal and an external terminal at one end of the common mode filter and another end of the common mode filter, respectively, wherein each of the external terminals of the at least four coil layers is overlapped with each of external terminals positioned over or under thereof in a vertical direction region, and wherein each of the insulating parts is provided only between the external terminal of one coil layer among the at least four coil layers and an external terminal positioned thereunder, and each of external terminals of the remaining coil layers contacts each of external terminals positioned thereover or thereunder.

7. A common mode filter comprising:
at least four coil layers each having a primary coil and a secondary coil; and
insulating parts, each extending between a respective starting point of each of the primary coil and the secondary coil positioned on a lowest layer among the at least four coil layers and a corresponding ending point of each of the primary coil and the secondary coil positioned on a highest layer among the at least four coil layers and configured to allow the primary coils to be connected in series from the lowest layer to the highest layer, and to allow the secondary coils to be connected in series from the lowest layer to the highest layer, wherein 2N coil layers are provided and the insulating parts are each provided for all odd-numbered layers of three layers or more, N being a natural number of 3 or more.

8. A common mode filter comprising:

a substrate;

an insulating layer disposed on the substrate; and at least four coil layers sequentially stacked in the insulating layer, each having a primary coil and a secondary coil, the primary coil and the secondary coil having a spiral shape, and being spaced apart from each other, wherein the primary coils of the at least four coil layers are connected in series and the secondary coils of the at least four coil layers are connected in series, and wherein each of the four coil layers includes a dummy primary external electrode and a dummy secondary external electrode that are separate from the primary coil and the secondary coil.

9. A common mode filter comprising:

a first primary external electrode and a second primary external electrode connected with each other in series through at least four coil layers;

a first secondary external electrode and a second secondary external electrode connected with each other in series through the at least four coil layers;

a first primary external terminal provided on each of the at least four coil layers and having at least a portion thereof positioned under the first primary external electrode; and a second primary external terminal provided on each of the at least four coil layers and having at least a portion thereof positioned in a vertical downward region of the second primary external electrode, wherein regions between the first primary external terminals are provided with a conductive material, and only one region among regions between the second primary external terminals is provided with a first part made of insulating material and the remaining regions are provided with the conductive material.

10. The common mode filter according to claim 9, further comprising:

a first secondary external terminal provided on each of the coil layers and having at least a portion thereof positioned under the first secondary external electrode; and a second secondary external terminal provided on each of the at least four coil layers and having at least a portion thereof positioned under the second secondary external electrode, wherein regions between the first secondary external terminals are provided with the conductive material, and only one region among regions between the second secondary external terminals is provided with a second part made of insulating material and the remaining regions are provided with the conductive material.

11. The common mode filter according to claim 10, further comprising an external plating terminal contacting an outer surface of at least one of the first primary external electrode, the second primary external electrode, the first secondary external electrode, and the second secondary external electrode.

12. The common mode filter according to claim 11, wherein the external plating terminal includes:

a first primary external plating terminal contacting at least portion of the outer surface of the first primary external electrode;

a second primary external plating terminal contacting at least portion of the outer surface of the second primary external electrode;

a first secondary external plating terminal contacting at least portion of the outer surface of the first secondary external electrode; and a second secondary external plating terminal contacting at least portion of the outer surface of the second secondary external electrode.

13. The common mode filter according to claim 12, wherein the primary external terminals having at least a portion positioned under the first part made of insulating material and the second primary external plating terminal are not directly in contact with each other, and the primary external terminals having at least a portion positioned under the second part made of insulating material and the second secondary external plating terminal are not directly in contact with each other.

14. The common mode filter according to claim 12, wherein a first insulating wall made of insulating material is provided between the second primary external terminals and the second primary external plating terminal, and a second insulating wall made of insulating material is provided between the second secondary external terminals and the second secondary external plating terminal.

15. A signal passing module provided in a first electronic device to perform a signal transmission and reception between a second electronic device and the first electronic device, the signal passing module comprising:

a first terminal having the second electronic device selectively connected or blocked thereto or therefrom;

a common mode filter of claim 9 connected to the first terminal; and a second terminal outputting a signal in which at least a portion of common mode noise is removed by the common mode filter.

16. The signal passing module according to claim 15, wherein the first primary external electrode and the first secondary external electrode are connected to the first terminal, and the second primary external electrode and the second secondary external electrode are connected to the second terminal.

17. The signal passing module according to claim 16, wherein the common mode filter and the second terminal further have a filter provided therebetween.

18. A common mode filter comprising:

a first coil layer having a first primary coil and a first secondary coil provided in a spiral shape on a single plane surface and spaced apart from each other by a preset distance;

a first primary external terminal formed in the first coil layer and provided to one end of the first primary coil;

a first primary internal terminal formed in the first coil layer and provided to the other end of the first primary coil;

a first secondary external terminal formed in the first coil layer and provided to one end of the first secondary coil;

a first secondary internal terminal formed in the first coil layer and provided to the other end of the first secondary coil;

a second coil layer having a second primary coil and a second secondary coil provided in a spiral shape on a single plane surface and spaced apart from each other by a preset distance;
a second primary external terminal formed in the second coil layer and provided to one end of the second primary coil;
a second primary internal terminal formed in the second coil layer and provided to the other end of the second primary coil;
a second secondary external terminal formed in the second coil layer and provided to one end of the second secondary coil;
a second secondary internal terminal formed in the second coil layer and provided to the other end of the second secondary coil;
a third coil layer having a third primary coil and a third secondary coil provided in a spiral shape on a single plane surface and spaced apart from each other by a preset distance;
a third primary external terminal formed in the third coil layer and provided to one end of the third primary coil;
a third primary internal terminal formed in the third coil layer and provided to the other end of the third primary coil;
a third secondary external terminal formed in the third coil layer and provided to one end of the third secondary coil;
a third secondary internal terminal formed in the third coil layer and provided to the other end of the third secondary coil;
a fourth coil layer having a fourth primary coil and a fourth secondary coil provided in a spiral shape on a single plane surface and spaced apart from each other by a preset distance;
a fourth primary external terminal formed in the fourth coil layer and provided to one end of the fourth primary coil;
a fourth primary internal terminal formed in the fourth coil layer and provided to the other end of the fourth primary coil;
a fourth secondary external terminal formed in the fourth coil layer and provided to one end of the fourth secondary coil; and
a fourth secondary internal terminal formed in the fourth coil layer and provided to the other end of the fourth secondary coil, wherein:
the first coil layer, the second coil layer, the third coil layer, and the fourth coil layer are sequentially stacked,
the first primary internal terminal is in contact with the second primary internal terminal directly or through a via,
the second primary external terminal is in contact with the third primary external terminal directly or through a via,
the third primary internal terminal is in contact with the fourth primary internal terminal directly or through a via,
a first part made of insulating material is provided between the third primary external terminal and the fourth primary external terminal,
the first secondary internal terminal is in contact with the second secondary internal terminal directly or through a via,
the second secondary external terminal is in contact with the third secondary external terminal directly or through a via,
the third secondary internal terminal is in contact with the fourth secondary internal terminal directly or through a via, and
a second part made of insulating material is provided between the third secondary external terminal and the fourth secondary external terminal.

19. The common mode filter according to claim 18, further comprising:
a first primary external electrode provided on the first primary external terminal;
a second primary external electrode provided on the fourth primary external terminal;
a first secondary external electrode provided on the first secondary external terminal; and
a second secondary external electrode provided on the fourth secondary external terminal.

20. The common mode filter according to claim 19, further comprising:
a first primary external plating terminal contacting at least portion of an outer surface of the first primary external electrode;
a second primary external plating terminal contacting at least portion of an outer surface of the second primary external electrode;
a first secondary external plating terminal contacting at least portion of an outer surface of the first secondary external electrode; and
a second secondary external plating terminal contacting at least portion of an outer surface of the second secondary external electrode.

21. The common mode filter according to claim 20, wherein the second primary external plating terminal is not directly in contact with the third primary external terminal, and
the second secondary external plating terminal is not directly in contact with the third secondary external terminal.

22. The common mode filter according to claim 20, wherein the second primary external plating terminal is in contact with only the second primary external electrode through a conductive material, and
the second secondary external plating terminal is in contact with only the second secondary external electrode through a conductive material.

23. The common mode filter according to claim 22, further comprising:
a first insulating wall provided between the second primary external plating terminal and the third primary external terminal and made of an insulating material; and
a second insulating wall provided between the second secondary external plating terminal and the third secondary external terminal and made of an insulating material.

24. A common mode filter comprising:
a substrate;
an insulating layer disposed on the substrate;
at least four coil layers sequentially stacked in the insulating layer, each having a primary coil and a secondary coil, the primary coil and the secondary coil having a spiral shape, and being spaced apart from each other,
a magnetic body disposed on the substrate and the insulating layer;
a first primary external electrode and a second primary external electrode connected via the primary coils of the at least four coil layers; and a first secondary external electrode and a second secondary external electrode connected via the secondary coils of the at least four coil layers, wherein the primary coils of the at least four coil layers are connected in series and the secondary coils of the at least four coil layers are connected in series, and wherein the first and second primary external electrodes and the first and second secondary external electrodes are disposed on four corners of the at least four coil layers.

25. The common mode filter of claim 24, further comprising:

a first primary external plating terminal disposed on the first primary external electrode;

a second primary external plating terminal disposed on the second primary external electrode;

a first secondary external plating terminal disposed on the first secondary external electrode; and a second secondary external plating terminal disposed on the second secondary external electrode.

26. The common mode filter of claim 25, further comprising:

a first insulating wall disposed between a third primary external terminal of the at least four coil layers and the second primary external plating terminal; and a second insulating wall disposed between the second secondary external terminal of the at least four coil layers and a third secondary external terminal of the at least four coil layers.

27. The common mode filter of claim 24, wherein the primary coil of each of the at least four coil layers has a primary external terminal and a primary internal terminal at corresponding ends thereof, and the secondary coil of each of the at least four coil layers has a secondary external terminal and a secondary internal terminal at corresponding ends thereof.

28. The common mode filter of claim 27, further comprising:

a first insulator between a second primary external terminal of two of the at least four coil layers; and a second insulator between a second secondary external terminal of two of the at least four coil layers.

29. The common mode filter of claim 27, wherein the primary internal terminals of two of the at least four coil layers are connected with a primary via and the primary external terminals of another two of the at least four coil layers are connected with each other.

30. The common mode filter of claim 27, wherein the secondary internal terminals of two of the at least four coil layers are connected with a secondary via and the secondary external terminals of another two of the at least four coil layers are connected with each other.

* * * * *